United States Patent
Ozawa et al.

(10) Patent No.: US 7,338,844 B2
(45) Date of Patent: Mar. 4, 2008

(54) METHOD OF MANUFACTURING ELECTRO-OPTICAL DEVICE HAVING A PLURALITY OF UNIT REGIONS ARRANGED IN A MATRIX

(75) Inventors: Tokuro Ozawa, Suwa (JP); Kenji Hayashi, Suwa (JP); Ayae Endo, Kai (JP); Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/958,405

(22) Filed: Oct. 6, 2004

(65) Prior Publication Data

US 2005/0104508 A1 May 19, 2005

(30) Foreign Application Priority Data

Oct. 14, 2003 (JP) .............................. 2003-353651
Oct. 14, 2003 (JP) .............................. 2003-353652

(51) Int. Cl.
*H01L 21/00* (2006.01)

(52) U.S. Cl. .......................... 438/149; 438/48; 438/82; 438/99

(58) Field of Classification Search .................. 438/48, 438/82, 99, 128, 149; 257/59, 72
See application file for complete search history.

(56) References Cited

U.S. PATENT DOCUMENTS

| | | | | |
|---|---|---|---|---|
| 4,973,138 A | * | 11/1990 | Yamazaki et al. | 349/157 |
| 5,831,703 A | * | 11/1998 | Nishiguchi et al. | 349/117 |
| 6,628,067 B2 | * | 9/2003 | Kobayashi et al. | 313/504 |
| 6,650,393 B1 | * | 11/2003 | Nishiguchi | 349/156 |
| 6,835,953 B2 | * | 12/2004 | Cok et al. | 257/59 |
| 6,933,671 B2 | * | 8/2005 | Nakanishi | 313/500 |
| 6,947,114 B2 | * | 9/2005 | Yamada et al. | 349/129 |
| 7,023,407 B2 | | 4/2006 | Nakanishi | |
| 7,075,613 B2 | * | 7/2006 | Kumar et al. | 349/156 |
| 2003/0054186 A1 | | 3/2003 | Miyashita et al. | |

FOREIGN PATENT DOCUMENTS

| | | |
|---|---|---|
| JP | A-10-39791 | 2/1998 |
| JP | A 11-16679 | 1/1999 |
| JP | A 2000-173777 | 6/2000 |
| JP | A-2001-244081 | 9/2001 |
| JP | A 2001-297876 | 10/2001 |
| JP | A 2002-208479 | 7/2002 |
| JP | A 2002-365632 | 12/2002 |
| JP | A 2003-45658 | 2/2003 |
| KR | 1995-11629 B | 10/1995 |
| KR | 2000-10410 A | 2/2000 |
| KR | 2003-64322 A | 7/2003 |

* cited by examiner

*Primary Examiner*—Ori Nadav
(74) *Attorney, Agent, or Firm*—Oliff & Berridge, PLC

(57) ABSTRACT

A method of manufacturing an electro-optical device having a plurality of unit regions arranged in a matrix on a surface of a flat plate-shaped base substrate. In each of the plurality of unit regions, a pixel electrode is formed. A counter electrode is formed on an opposite side to the base substrate with respect to the pixel electrodes. In pixel regions, which are first unit regions constituting a predetermined image among the plurality of unit regions, OLED elements are selectively formed. The OLED elements are interposed between the respective pixel electrodes and the counter electrode. In non-pixel regions, which are second unit regions other than the first unit regions among the plurality of unit regions, insulators are formed. The insulators are interposed between the respective pixel electrodes and the counter electrode.

9 Claims, 20 Drawing Sheets

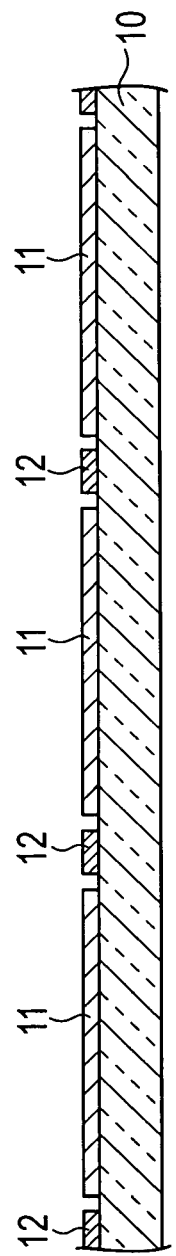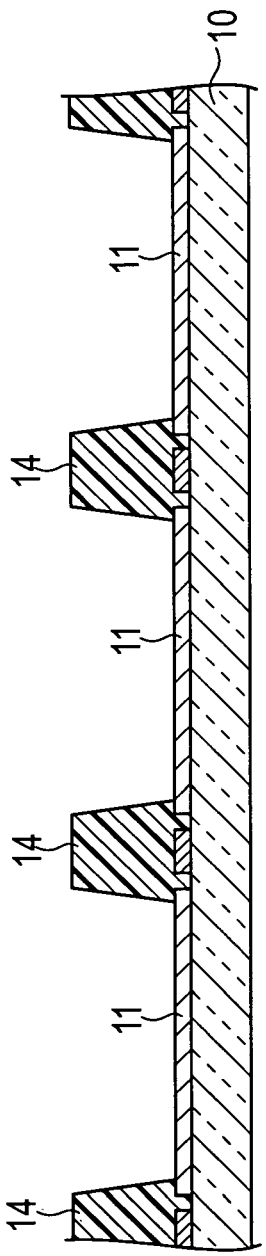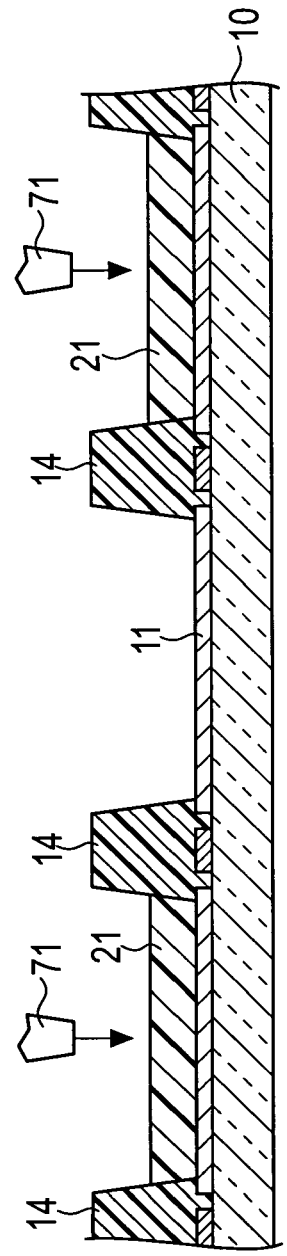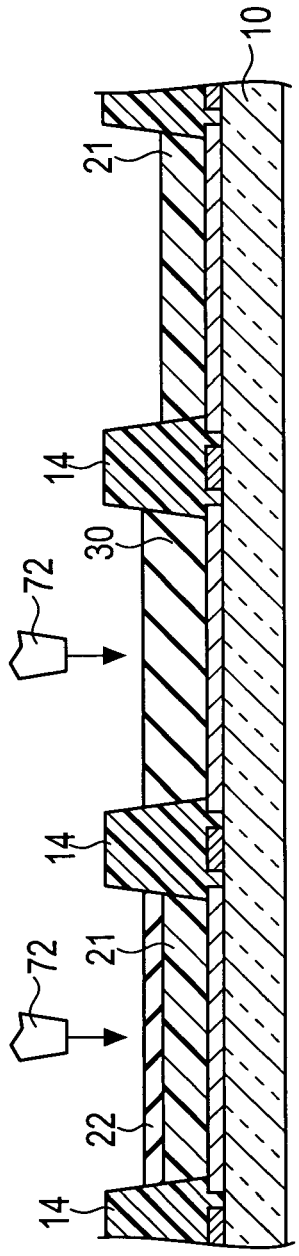

<DISPLAY WIRING>

<NON-DISPLAY WIRING>

METHOD OF MANUFACTURING ELECTRO-OPTICAL DEVICE HAVING A PLURALITY OF UNIT REGIONS ARRANGED IN A MATRIX

BACKGROUND OF THE INVENTION

1. Field of Invention

The present invention relates to a technique for displaying an image using an electro-optical element which converts electrical actions, such as the supply of current or the application of voltage, into optical actions, such as a change in brightness (grayscale) or transmittance.

2. Description of Related Art

A device for displaying an image using an electro-optical element, such as an organic light emitting diode (hereinafter, referred to as 'an OLED') element, is mainly divided into a dot matrix type device in which various images are displayed by a plurality of pixels arranged in a matrix and a segment type device in which a specific image is fixedly displayed. Among them, in the segment type electro-optical device, the electro-optical element is driven by an electrode which is patterned in a shape corresponding to an image to be displayed, for example, as described in Japanese Unexamined Patent Application Publication No. 2001-244081.

SUMMARY OF THE INVENTION

In the segment type electro-optical device, it is necessary to create photo masks for patterning the electrodes for every display image, which results in a problem in that a great deal of cost is needed to newly manufacture an electro-optical device for another image. Therefore, it is an object of the present invention to reduce the cost required for changing an image to be displayed.

In order to attain the above object, electro-optical devices according to the present invention have the following first to fourth features. Moreover, in the present invention, the electro-optical element means an element which converts electrical actions, such as the supply of current or the application of voltage, into optical actions, such as a change in brightness (light emitting amount) or transmittance. Typically, the electro-optical element includes an organic electroluminescent element or an organic light emitting diode (OLED) element, such as a light emitting polymer. Further, the electro-optical device according to the present invention can be applied to display devices for various electronic apparatuses.

An electro-optical device according to the first feature of the present invention comprises a flat plate-shaped base substrate, a first electrode provided in a plurality of unit regions which are divided on a surface of the base substrate, a second electrode provided on an opposite side to the base substrate with respect to the first electrode, and electro-optical elements each provided selectively at pixel regions, which are unit regions constituting a predetermined image among the plurality of unit regions, and interposed between the first electrode and the second electrode. The specified form of this aspect will be described below as a first embodiment.

According to such a construction, the respective electro-optical elements are provided in the pixel regions selected according to a desired image, such that the image is displayed. For this reason, even in the case in which an electro-optical device for displaying another image is to be newly manufactured, it is not necessary to prepare photo masks for patterning the respective electrodes for every image. Therefore, according to the present invention, it is possible to reduce the manufacturing costs of the electro-optical devices which display different images.

If the first electrode and the second electrode are electrically connected to each other in each of the unit regions (non-pixel regions) other than display regions among the plurality of unit regions, a current flows into the first electrode and the second electrode in each of the non-pixel regions when the electro-optical element in each of the pixel regions is driven, and thus power is consumed uselessly. Thus, in a preferred aspect of the electro-optical device having the first feature, an insulator for electrically isolating the first electrode from the second electrode is provided in each of the non-pixel regions, which are the unit regions other than the pixel regions among the plurality of unit regions. According to this aspect, a current does not flow into the first electrode and the second electrode in each of the non-pixel regions, and thus the power consumption is reduced.

An electro-optical device according to the second feature of the present invention comprises a flat plate-shaped base substrate, a first electrode provided in a plurality of unit regions, which are divided on a surface of the base substrate, a second electrode provided on an opposite side to the base substrate with respect to the first electrode, electro-optical elements each provided in each of the plurality of unit regions and interposed between the first electrode and the second electrode, and insulators each selectively provided in non-pixel regions, which are unit regions other than unit regions constituting a predetermined image among the plurality of unit regions such that the first electrode and the second electrode are electrically isolated from each other.

According to such a construction, an insulator is provided in each of the non-pixel regions selected according to a desired image, and the image is displayed by the electro-optical elements provided in the respective pixel regions. For this reason, even in the case in which an electro-optical device for displaying another image is to be newly manufactured, it is not necessary to prepare photo masks for patterning the respective electrodes for every image. Therefore, according to the present invention, it is possible to reduce the cost required for manufacturing a new electro-optical device.

In a preferred aspect of the electro-optical device having the first feature or the second feature, a partial insulator overlapping a part of the electro-optical element as viewed from the direction perpendicular to the surface of the base substrate and being interposed between the first electrode and the second electrode is provided. According to this aspect, the amount of light emitting from the electro-optical element to a viewing side (or the amount of light passing through the electro-optical element to a viewing side) is determined according to the rate of the partial insulator to the pixel region, and thus a rich grayscale is displayed. For example, even in the case in which voltages applied to the respective electro-optical elements are the same over all unit regions, the grayscales displayed by the respective electro-optical elements are different from each other according to the size of the partial insulator provided to overlap the electro-optical element. In other words, the grayscales are displayed, without requiring for a mechanism that makes an electrical action be different for every grayscale (for example, a mechanism which makes voltages applied to the respective electro-optical elements be different for every unit region).

In addition, in another aspect, a spacer is provided in the gap between adjacent unit regions, and the electro-optical element is provided in a region surrounded by the spacer. According to this aspect, liquid droplets including an electro-optical material are discharged in the unit region surrounded by the spacer, and thus it is possible to use a relatively low-priced method (a liquid droplet ejection method) so as to form the electro-optical element. Further, the electro-optical element can be formed by other methods.

In another aspect of the electro-optical device having the first feature or the second feature, each of the first electrode and the second electrode is a single electrode extending over the plurality of unit regions. According to this aspect, it is not necessary to form the first electrode and the second electrode in a minute wiring pattern (patterning), and thus it is possible to further reduce the manufacturing costs. However, the first electrode may be formed of a plurality of pixel electrodes provided in different unit regions. According to this aspect, it is possible to apply different voltages to the pixel electrodes provided in the respective unit regions. For example, when the plurality of unit regions are divided into two or more groups corresponding to different colors, different voltages for every group to which the respective unit regions belong are applied to the pixel electrodes provided in the respective unit regions, such that it is possible to obtain different optical characteristics for every color. In addition, in the aspect in which the first electrode is formed of the plurality of pixel electrodes, a resistive layer interposed between the first electrode and the second electrode is made of a conductive material having a predetermined resistivity. According to this aspect, even though any one of the pixel electrodes and the second electrode are electrically shorted due to a cause, it is possible to prevent other pixel electrodes connected to the pixel electrode via wiring lines (and the electro-optical element corresponding to the pixel electrode) from being influenced by the electrical short.

An electro-optical device according to the third feature of the present invention comprises a plurality of pixel electrodes arranged in a surface shape, a plurality of electro-optical elements provided on the respective surfaces of the plurality of pixel electrodes, a counter electrode opposite to the plurality of pixel electrodes with the respective electro-optical elements interposed therebetween, and a connecting portion selectively provided between a power supply circuit and one or more pixel electrodes selected according to a predetermined image among the plurality of pixel electrodes for connecting the one or more pixel electrodes and the power supply circuit. The specified form of this construction will be described below as a second embodiment and a third embodiment.

According to this construction, the connecting portion is selectively provided to connect the pixel electrodes selected according to a desired image to the power supply circuit. Therefore, even in the case in which an electro-optical device for displaying another image is to be newly manufactured, it is not necessary to prepare photo masks for patterning the respective electrodes for every image. Therefore, according to the present invention, it is possible to reduce the cost required for manufacturing a new electro-optical device.

In another aspect of the electro-optical device according to the third feature, a wiring line connected to the power supply circuit is provided, and further the connecting portion is provided between one or more pixel electrodes and the wiring line. According to this aspect, the presence and absence of electrical connection of each of the plurality of pixel electrodes to the power supply circuit are distinguished, and thus it is possible to display more various images. Moreover, the specified form of this aspect will be described below. Meanwhile, in a further aspect of the present invention, a plurality of wiring lines to which one or a plurality of pixel electrodes is connected is provided, and the connecting portion is provided between the respective wiring lines, which are connected to one or more pixel electrodes selected according to a predetermined image, among the plurality of wirings selected and the power supply circuit. According to this aspect, the presence and absence of the electrical connection to the power supply circuit are selected for every one or a plurality of pixel electrodes connected commonly to the respective wiring lines, and thus it is possible to design a simple construction. Moreover, the specified form of this aspect will be described below as the third embodiment.

An electro-optical device according to the fourth feature of the present invention comprises a plurality of pixel electrodes arranged in a surface shape, a plurality of electro-optical elements provided on the respective surfaces of the pixel electrodes, a counter electrode opposite to the plurality of pixel electrodes with the respective electro-optical element interposed therebetween, a plurality of connecting portions provided between the pixel electrodes and a power supply circuit for connecting the corresponding pixel electrode and the power supply circuit, a resistance value of each of the plurality of connection portions being selected according to a predetermined image. The specified form of this aspect will be described below as a fourth embodiment.

According to this construction, the resistance values of the connecting portions interposed between the respective pixel electrodes and the power supply circuit are suitably selected, such that a desired image (in particular, a multi-level grayscale image) is displayed. Therefore, even in the case in which an electro-optical device for displaying another image is to be newly manufactured, it is not necessary to prepare photo masks for patterning the respective electrodes for every image. For this reason, according to the present invention, it is possible to reduce the cost required for manufacturing a new electro-optical device.

In another aspect of the electro-optical device according to the fourth feature, a wiring line connected to the power supply circuit is provided, and a plurality of connecting portions are provided between the respective pixel electrodes and the wiring line. According to this aspect, a resistance value of a path from the corresponding pixel electrode to the power supply circuit is selected for every pixel electrode, and thus it is possible to display more various images. Further, in this aspect, the resistance values of the respective connecting portions are determined by the number of connecting portions for connecting the respective pixel electrodes to the wiring lines or the type of the conductive material of the connecting portion. Meanwhile, in a further aspect of the present invention, a plurality of wiring lines to which one or a plurality of pixel electrodes is connected are provided, and a plurality of connecting portions are provided between the respective wiring lines and the power supply circuit. According to this aspect, a resistance value of a path reaching the power supply circuit is selected for every one or a plurality of pixel electrodes that are commonly connected to the respective wiring lines, and thus it is possible to design a simple construction.

Moreover, in a preferred aspect of the electro-optical device having the above-mentioned third and fourth features, a resistive layer made of a conductive material having a predetermined resistivity is interposed between the pixel electrodes and the counter electrode. According to this aspect, even when any one of the pixel electrodes and the counter electrode are electrically shorted due to a cause, it is possible to prevent other pixel electrodes to be connected to the pixel electrode from being influenced by the electrical short. In this aspect, the resistive layer is preferably provided on an opposite side to the viewing side (that is, a side at which a viewer is positioned to view an image to be displayed) as viewed from the electro-optical element. In this aspect, light emitted from the electro-optical element (or light passing through the electro-optical element) is emitted to the viewing side without passing through the resistive layer. Therefore, it is possible to suppress the loss of light and thus to maintain a good display quality.

Further, in the electro-optical device having the third feature or the fourth feature, a film structure having openings may be formed on the surface of the base substrate, and the connecting portion may be provided in a region surrounded by an inner circumferential edge of the corresponding opening. According to this construction, it is possible to use a relatively low-priced method (a liquid droplet ejection method) in which liquid droplets including a conductive material are discharged in the region surrounded by the opening, thereby forming the connection portion. Needless to say, the connecting portion may be formed with other methods.

The electro-optical devices having the first to fourth features are respectively manufactured by methods including the following first to fourth features.

A manufacturing method according to the first feature of the present invention comprises a step of forming a first electrode in a plurality of unit regions which are divided on a surface of a flat plate-shaped base substrate, a step of selectively forming electro-optical elements in pixel regions, which are unit regions constituting a predetermined image among the plurality of unit regions, and a step of forming a second electrode opposite to the first electrode with the electro-optical elements interposed therebetween. According to this manufacturing method, it is possible to obtain an electro-optical device which displays a predetermined image and in which the electro-optical elements are selectively formed in a part of the plurality of unit regions. In this case, it is not necessary to prepare different photo masks for every image to be displayed. Therefore, according to the present invention, it is possible to reduce the cost required for manufacturing a new electro-optical device.

A manufacturing method according to the second feature of the present invention comprises a step of forming a first electrode in a plurality of unit regions which are divided on a surface of a flat plate-shaped base substrate, a step of forming electro-optical elements in each of the plurality of unit regions, a step of forming a second electrode opposite to the first electrode with the electro-optical elements interposed therebetween, and a step of forming insulators for electrically isolating the first electrode from the second electrode in non-pixel regions, which are unit regions other than unit regions constituting a predetermined image among the plurality of unit regions. According to this method, it is possible to obtain an electro-optical device which displays a predetermined image and in which the insulators are selectively formed in a part of the plurality of unit regions. In this case, it is not necessary to prepare different photo masks for every image to be displayed. Therefore, according to the present invention, it is possible to reduce the cost required for manufacturing a new electro-optical device.

In the step of forming the electro-optical elements of the manufacturing method having the first feature or the second feature, liquid droplets including an electro-optical material are ejected from an ejection slot and land on the base substrate, such that the electro-optical elements are formed.

According to this method, it is possible to further reduce the manufacturing costs. In addition, in the step of forming the electro-optical elements including a step of forming a spacer in the gap between adjacent unit regions prior to forming the electro-optical elements, the liquid droplets including an electro-optical material may land on a region surrounded by the spacer. According to this method, it is possible to form the electro-optical elements at the desired positions. Meanwhile, the insulators may also be formed by a liquid droplet ejection method. That is, in the step of forming the insulators of the manufacturing method according to the present invention, liquid droplets including an insulating material are ejected from an ejection slot and land on the base substrate to thereby form the insulators.

Further, in the case in which a step of forming partial insulators interposed between the first electrode and the second electrode so as to overlap a part of the electro-optical element as viewed from a direction vertical to the surface of the base substrate is performed, liquid droplets including an insulating material are ejected from an ejection slot and land on the base substrate to thereby form the partial insulators. According to this method, it is possible to reduce the manufacturing costs as compared with the case in which the partial insulators are formed by a photolithography technique.

Moreover, in the manufacturing method having the first feature or the second feature, a sequence in which the respective steps are performed is arbitrarily determined, except that a sequence of the respective steps is clearly specified. For example, in the manufacturing method according to the first feature, the sequence in which the step of forming the first electrode, the step of forming the electro-optical elements and the step of forming the second electrode (in addition, the step of forming the insulators in the manufacturing method according to the second feature) are performed is passed over without mention.

A manufacturing method according to the third feature of the present invention comprises a step of forming a plurality of pixel electrodes in a surface-shaped arrangement, a step of forming electro-optical elements on the surfaces of the respective pixel electrodes, a step of forming a counter electrode opposite to the plurality of pixel electrodes with the electro-optical elements interposed therebetween, and a step of selectively forming a connecting portion for connecting a power supply circuit to one or more pixel electrodes selected according to a predetermined image among the plurality of pixel electrodes. According to this method, it is possible to obtain an electro-optical device which displays the predetermined image and in which the connecting portion is selectively formed to connect the pixel electrodes to the power supply circuit. In this case, it is not necessary to prepare different photo masks for every image to be displayed. Therefore, according to the present invention, it is possible to reduce the cost required for manufacturing a new electro-optical device.

A manufacturing method according to the fourth feature of the present invention comprises a step of forming a plurality of pixel electrodes in a surface-shaped arrangement, a step of forming electro-optical elements on the surfaces of the respective pixel electrodes, a step of forming a counter electrode opposite to the plurality of pixel electrodes with the electro-optical elements interposed therebetween, and a step of forming a plurality of connecting portions for connecting the respective pixel electrodes to the power supply circuit, the respective connecting portions having a resistance value selected according to a predetermined image. According to this method, it is possible to obtain an electro-optical device which displays the predetermined image and in which the resistance values of the respective connection portions which are interposed between the pixel electrodes and the power supply circuit are suitably selected. In this case, it is not necessary to prepare different photo masks for every image to be displayed. Therefore, according to the present invention, it is possible to reduce the cost required for manufacturing a new electro-optical device.

In the step of forming the connecting portion of the manufacturing method having the third feature or the fourth feature, liquid droplets including a conductive material may be ejected from an ejection slot and land to thereby form the connecting portions. According to this method, it is possible to reduce the manufacturing costs as compared with the case in which the connecting portions are formed by a photolithography technique.

Moreover, in the manufacturing method having the third feature or the fourth feature, a sequence in which the respective steps are performed is arbitrarily determined. For example, in the manufacturing method according to the third feature, the step of forming the plurality of pixel electrodes, the step of forming the electro-optical elements, the step of forming the counter electrode, and the step of forming the connecting portions may be performed in any sequence.

BRIEF DESCRIPTION OF THE DRAWINGS

FIGS. 4(a) to 4(d) are process views showing a manufacturing method of the electro-optical device;

DETAILED DESCRIPTION OF PREFERRED EMBODIMENTS

Embodiments of the present invention will be described with reference to the accompanying drawings. Moreover, hereinafter, the embodiments in which the present invention is applied to an electro-optical device using an OLED element as an electro-optical element are described, but the application range of the present invention is not limited to the electro-optical device. Further, in the respective drawings described below, the dimensions or rates of the respective elements are shown to be suitably different from the actual dimensions or rates.

A: First Embodiment

<A-1: Construction of Electro-Optical Device>

Figure 1:
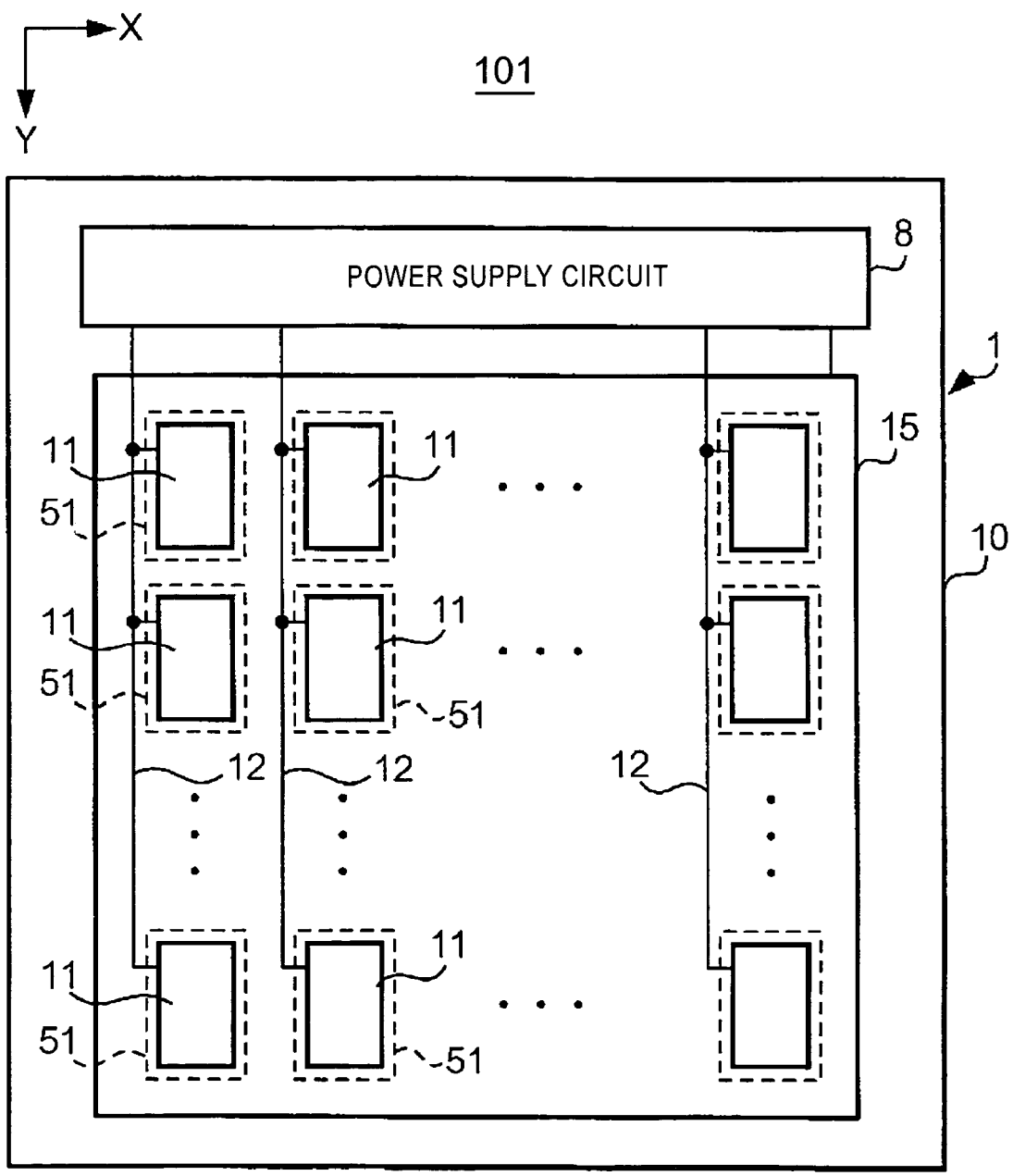
FIG. 1 is a block diagram showing a construction of an electro-optical device according to a first embodiment of the present invention.
Figure 2:
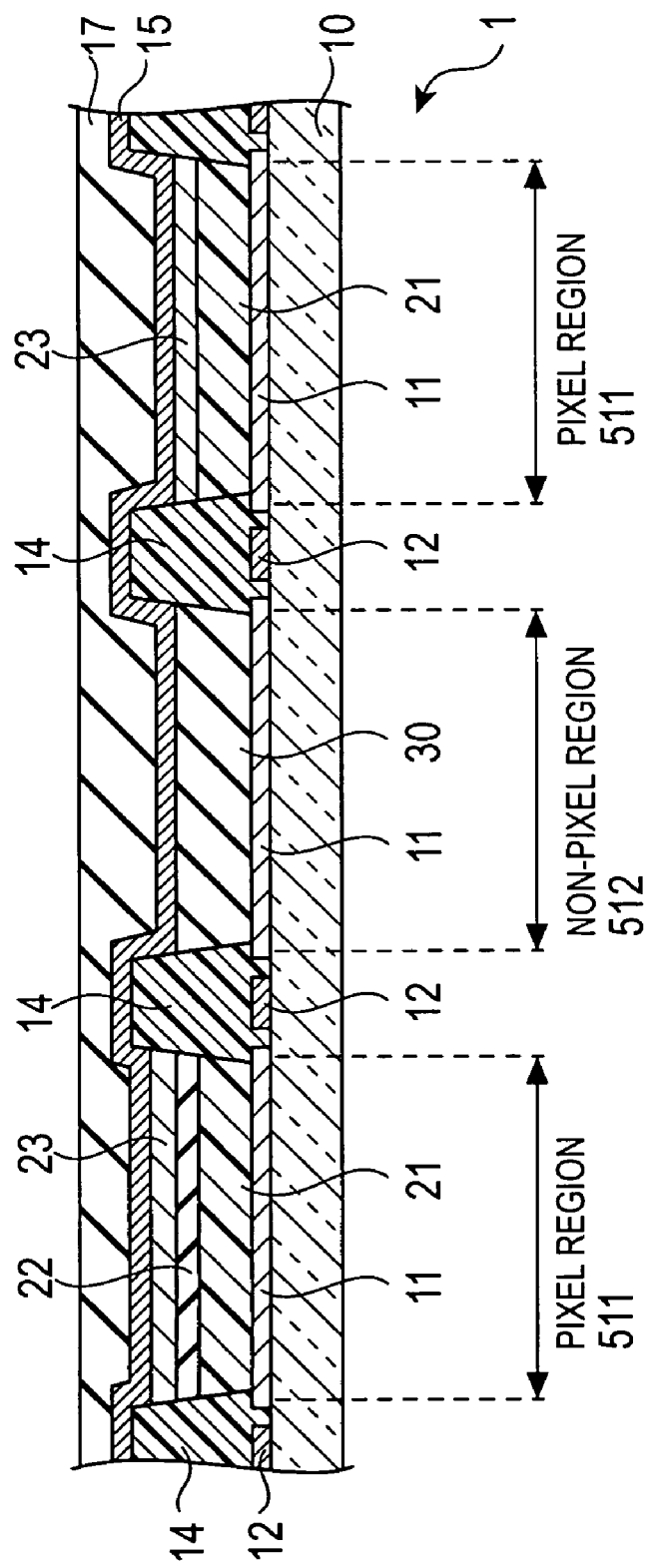
FIG. 2 is a cross-sectional view showing a construction of a display panel of the electro-optical device.

FIG. 1 is a block diagram showing a construction of an electro-optical device according to the present embodiment. As shown in FIG. 1, an electro-optical device 101 comprises a display panel 1 and a power supply circuit 8. As shown in FIGS. 1 and 2 (a cross-sectional view of the display panel 1), the display panel 1 comprises a flat plate-shaped base substrate 10. The base substrate 10 is made of glass or plastic. The display panel 1 according to the present embodiment is a bottom emission type panel in which light emitted from the OLED element described below passes through the base substrate 10 and exits to a viewing side (in FIG. 2, a lower side).

The surface of the base substrate 10 is divided into a plurality of regions (hereinafter, referred to as 'unit regions') 51 arranged in a matrix in the X direction and the Y direction. As shown in FIGS. 1 and 2, on the surface of the base substrate 10, a plurality of pixel electrodes 11, each functioning as an anode of the OLED element, are formed. The pixel electrodes 11 are rectangular electrodes provided in the respective unit regions 51. The respective pixel electrodes 11 are made of a conductive material having a transmissive property, such as indium tin oxide (ITO). In addition, wiring lines 12 are formed in the gaps between adjacent pixel electrodes 11 in the X direction. The wiring lines 12 extend in the Y direction, of which one ends are connected to the power supply circuit 8. The plurality of pixel electrodes 11 arranged in the Y direction are connected to the power supply circuit 8 via the common wiring lines 12.

As shown in FIG. 2, on the surface of the base substrate 10 in which the pixel electrodes 11 and the wiring lines 12 are formed, spacers 14 are formed to divide the respective unit regions 51. The spacers 14 are formed in a lattice shape so as to overlap the respective gaps between adjacent unit regions 51 in the X direction or the Y direction and project from the surface of the base substrate 10. Regions that are surrounded and divided by the spacers 14 correspond to the unit regions 51. The respective wiring lines 12 are covered with portions of the lattice-shaped spacers 14 extending in the Y direction, as shown in FIG. 2.

Meanwhile, the surface of the base substrate 10 on which the plurality of pixel electrodes 11 are provided is covered with the counter electrode 15. The counter electrode 15 is connected to the power supply circuit 8 to function as a cathode of the OLED element. The counter electrode 15 is a single electrode extending over the plurality of unit regions 51. The counter electrode 15 is made of a conductive material having a reflective property, such as a simple metallic material of aluminum or silver, or an alloy mainly containing the metallic material. The entire surface of the base substrate 10 on which the counter electrode 15 is formed is covered with a sealing layer 17. The sealing layer 17 is a layer for preventing the intrusion of oxygen or moisture toward the base substrate 10. With the sealing layer 17, it is possible to prevent the counter electrode 15 or a light emitting layer formed on the base substrate 10 from contacting oxygen or moisture to be deteriorated.

Meanwhile, the power supply circuit 8 is a circuit for supplying power to the respective pixel electrodes 11 and the counter electrode 15. In detail, the power supply circuit 8 applies a high level power supply voltage to the respective pixel electrode 11 via the wiring lines 12 and a low level power supply voltage (a ground potential) to the counter electrode 15.

The electro-optical device 101 is a device for fixedly displaying a specific image (hereinafter, referred as to 'an object image'). In order to implement this display, the OLED elements 21 as the electro-optical elements are provided only in the unit regions 51 which are to be selected as ones corresponding to the respective dots constituting the object image among the plurality of unit regions 51. In detail, as shown in FIG. 2, in the respective unit regions 51 (hereinafter, specifically referred to as 'pixel regions 511') constituting the object image among the plurality of unit regions 51, the OLED element 21 is provided to be entered into a space (depression) of which all sides are surrounded by the spacers 14 such that the pixel electrode 11 becomes a bottom surface. The respective OLED elements 21 are interposed between the respective pixel electrodes 11 and the counter electrode 15. The respective OLED elements 21 have a structure in which a hole injecting layer, a hole transporting layer, a light emitting layer, an electron transporting layer, and an electron injecting layer are sequentially deposited as viewed from the side of the pixel electrode 11. The OLED elements 21 of the respective pixel regions 511 emit light having a wavelength corresponding to any one of red, green, and blue.

Figure 3:
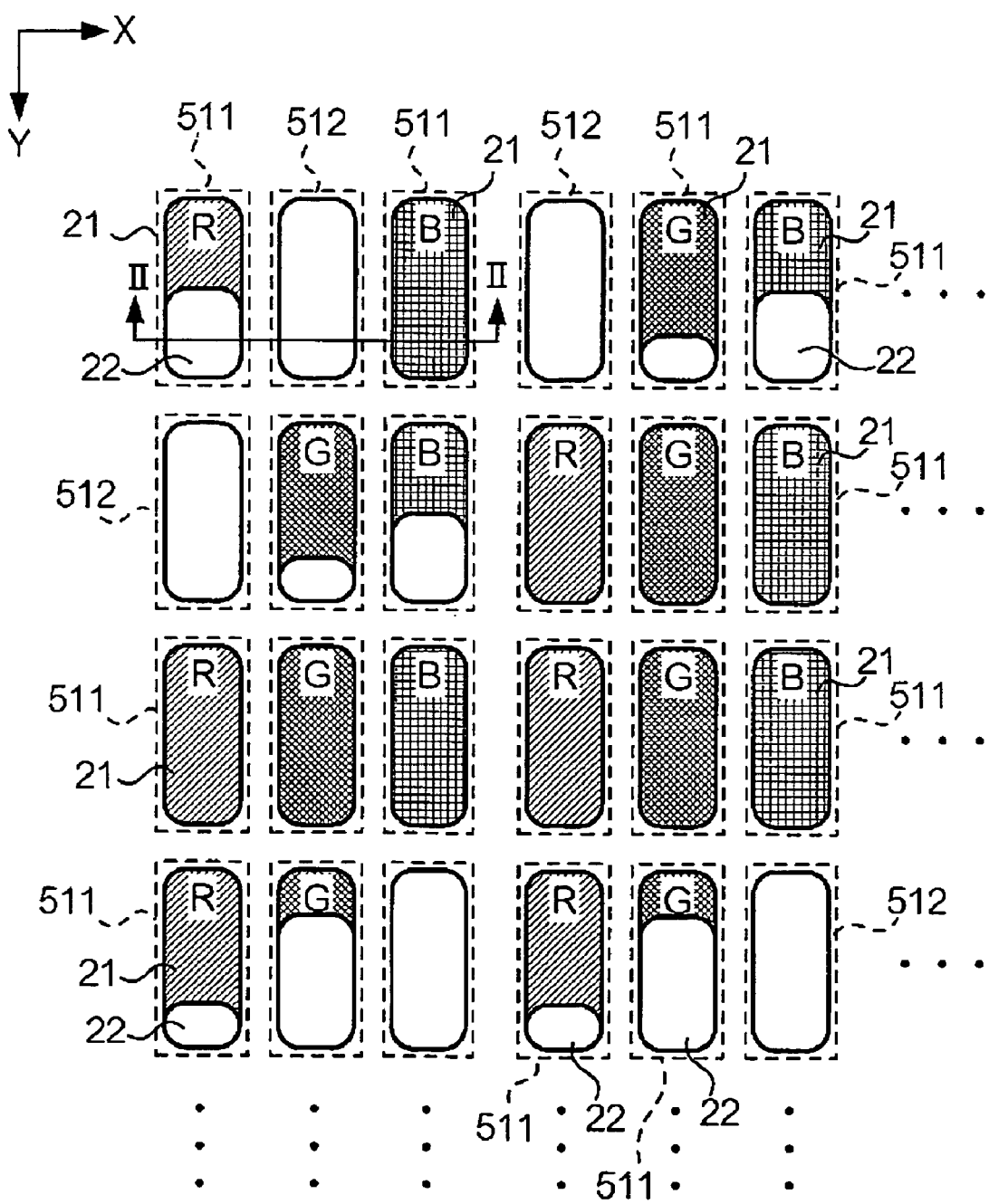
FIG. 3 is a plan view showing an aspect of the arrangement of pixel regions and non-pixel regions.

FIG. 3 is a plan view showing an aspect of the arrangement of the OLED elements 21 of the respective colors. A cross-sectional view from the line II-II of FIG. 3 corresponds to FIG. 2. As shown in FIG. 3, the OLED elements 21 having the same color are arranged in the plurality of pixel regions 511 which are arranged in the Y direction (a so-called stripe arrangement).

Meanwhile, as shown in FIGS. 2 and 3, in unit regions 51 (that is, unit regions 51 not corresponding to the respective dots constituting the object image, which are specifically referred to as 'not-pixel regions 512') other than the pixel regions 511 among the plurality of unit regions 51, the OLED elements 21 are not provided. Instead of that, in the respective non-pixel regions 512, as shown in FIG. 2, an insulator 30 is provided to be entered into a space of which all sides are surrounded by the spacers 14 such that the pixel electrode 11 becomes a bottom surface. The insulators 30 are made of a material having an electrically insulating property. Therefore, the respective insulators 30 are interposed between the pixel electrodes 11 and the counter electrode 15 to electrically isolate them. In such a construction, if a voltage is applied between the respective pixel electrodes 11 and the counter electrode 15 from the power supply circuit 8, the OLED elements 21 arranged only in the pixel regions 511 emit light having the respective colors, such that the object image is displayed. Here, in a construction in which the insulators 30 are not provided in the non-pixel regions 512, the respective pixel electrodes 11 and the counter electrode 15 are connected to each other, and a current flows through the non-pixel regions 512 when the object image is displayed, which results in useless power consumption. To the contrary, in the case in which the insulators 30 are provided like the present embodiment, the respective pixel electrodes 11 and the counter electrode 15 are electrically isolated from each other by the insulators 30, and a current does not flows through the non-pixel regions 512. Therefore, the power consumption is reduced. Needless to say, if the power consumption does not care, a construction in which the insulators 30 are not provided in the non-pixel regions 512 (that is, the respective pixel electrodes 11 and the counter electrode 15 are connected to each other) may also be adapted. Further, a construction in which the OLED element 21 comprised of the hole injecting layer, the hole transporting layer, the light emitting layer, the electron transporting layer, and the electron injecting layer is provided in the pixel regions 511, while at least the light emitting layer among these layers is not provided in the non-pixel region 512, may also be adapted. According to this construction, by allowing only the pixel regions 511 among the plurality of unit regions 51 to selectively emit light, the object image is displayed.

Further, as shown in FIGS. 2 and 3, in the pixel regions 511 (for example, a left pixel region 511 in FIG. 2) which are selected according to the grayscales of the respective dots constituting the object image among the plurality of pixel regions 511, partial insulators 22 are provided to overlap parts of the OLED elements 21 as viewed from a direction perpendicular to the surface of the base substrate 10. The partial insulators 22 are interposed between the respective pixel electrodes 11 and the counter electrode 15. The respective partial insulators 22 are made of a material having an electrically insulating property. In FIG. 2, the construction in which the respective partial insulators 22 are interposed between the respective OLED elements 21 and the counter electrode 15 is described. However, instead of or together with this construction, a construction in which the respective partial insulators 22 are interposed between the respective pixel electrodes 11 and the respective OLED elements 21 may be adapted. The amount of light generated from the OLED elements 21 of the respective pixel regions 511 and emitted to the viewing side corresponds to an area rate of the partial insulator 22 to the pixel region 511. For example, if the area of the partial insulator 22 to the pixel region 511 is large, the amount (brightness) of light generated from the OLED element 21 of the pixel region 511 to the viewing side is small. Further, if the area of the partial insulator 22 is small, the amount of light emitted from the OLED element 21 of the corresponding pixel region 511 to the viewing side is large. In such a manner, according to the present embodiment, the brightness (grayscale) of each of the pixel regions 511 is controlled arbitrarily by suitably adjusting the area of the partial insulator 22 which is to be provided in each of the pixel region 511. Therefore, regardless of an extremely simple construction of the display panel 1, various high-quality displays are implemented.

In addition, the respective pixel regions 511 are provided with a resistive layer 23. The resistive layer 23 is a film interposed between the pixel electrodes 11 and the counter electrode 15. The resistive layer 23 is made of a conductive layer having a predetermined resistivity. By the way, in a construction in which the resistive layer 23 is not provided between the pixel electrodes 11 and the counter electrode 15, any one of the pixel electrodes 11 and the counter electrode 15 may be electrically shorted by a cause. In this case, the potential of the wiring line 12 is lowered up to the potential of the counter electrode 15, which results in influencing other pixel electrodes 11 which are connected to the pixel electrodes 11 via the wiring lines 12. To the contrary, in the construction in which the resistive layer 23 is provided like the present embodiment, even though any one of the pixel electrodes 11 and the counter electrode 15 are electrically shorted, an influence of the electrical short on the pixel region 511 of other pixel electrodes 11 (the pixel electrodes 11 arranged in the Y direction) connected to the pixel electrode 11 via the wiring lines 12 is suppressed. Moreover, as shown in FIG. 2, in the present embodiment, an example in which the resistive layer 23 is provided between the OLED elements 21 and the counter electrode 15 is described. However, in the present invention, a construction in which the resistive layer 23 is provided between the pixel electrode 11 and the OLED element 21 may be adapted. However, in the bottom emission type display panel 1, light generated from the OLED element 21 is emitted from the pixel electrode 11 to the viewing side via the base substrate 10. Thus, from the viewpoint of suppressing the loss of light to secure brightness, a construction in which the resistive layer 23 is arranged on an opposite side to the viewing side as viewed from the OLED element 21 as shown in FIG. 2 (that is, a construction in which light generated from the OLED element 21 is emitted toward the base substrate 10 without passing through the resistive layer 23) is preferable.

<A-2: Manufacturing Method of Electro-Optical Device>

Next, a manufacturing method of the above-mentioned electro-optical device 101 will be described.

To begin with, as shown in FIG. 4(a), the wiring lines 12 and the pixel electrodes 11 are formed on the surface of the base substrate 10. More specifically, after a conductive thin film made of aluminum, silver or copper is formed with a film-forming technique, such as a sputtering method, a patterning process is performed on the thin film using a photolithography technique to form the wiring lines 12. Similarly, the pixel electrodes 11 are formed by performing a patterning process on a thin film made of a transparent conductive material, such as indium tin oxide or indium oxide zinc oxide-based amorphous. Moreover, the wiring lines 12 and the pixel electrodes 11 may be formed from a common conductive film with one process by removing the conductive thin film such that the regions corresponding to the wiring lines 12 and the pixel electrodes 11 remain. Further, in the case in which the display panel 1 is a top emission type, it is not necessary for the pixel electrodes 11 to have a light transmissive property. Thus, the pixel electrodes 11 may be made of a conductive material having a reflective property (or a conductive material not having a transmissive property), such as a simple metallic material of aluminum or silver, or an alloy containing mainly the metallic material.

Subsequently, as shown in FIG. 4(b), on the surface of the base substrate 10 on which the wiring lines 12 and the pixel electrodes 11 are formed, the spacers 14 are formed. More specifically, after a photosensitive organic material, such as polyimide, acryl, or polyamide, is applied on the base substrate 10 and is hardened by heating, an exposure and a development is performed on the thin film with a predetermined photo mask, such that lattice-shaped spacers 14 are obtained. In addition, a plasma treatment is performed to the spacers 14 using CF4, SiF4 or BF3 as a reaction gas, such that the surfaces of the spacers 14 are reformed to exhibit a liquid repelling property (a water repelling property). Moreover, the spacers 14 themselves may have a liquid repelling property by adding fluoride into the organic material constituting the spacers 14 without reforming the surfaces of the spacers 14.

Next, as shown in FIG. 4(c), the OLED elements 21 having the respective colors are selectively formed in the pixel regions 511 among the plurality of unit regions 51 which are divided by the spacers 14. In forming the OLED elements 21, a liquid droplet ejection method (an ink jet method) is used. That is, as shown in FIG. 4(c), an ejection slot 71 is disposed above the pixel regions 511 constituting a desired image among the plurality of unit regions 51, and then liquid droplets including an electro-optical material are discharged on the pixel regions 511 from the ejection slot 71. This process is repeated on all the pixel regions 511, and the liquid droplets are dried, such that the OLED elements 21 are obtained. Moreover, the hole transporting layer of the OLED element 21 is made of, for example, polythiophene derivative or polypyrrole derivative, or a material with doped into the derivatives. More specifically, a dispersion (PEDOT/PSS distribution) in which 3,4-polyethylenedioxythiophene is dispersed into a solvent of polystyrenesulfonic acid and then water is added is ejected from the ejection slot 71, such that the hole transporting layer is formed. Further, the light emitting layer of the OLED element 21 is made of various known materials, such as polyfluorene derivative (PV), polyparaphenylenevinylene derivative (PPV), polyphenylene derivative (PP), polyparaphenylene derivative (PPP), polyvinylcarbazole derivative (PVK), polythiophene derivative, polydialkylfluorene (PDAF), polyfluorenebenzothiadiazole (PFBT), polyalkylthiophene (PAT) or polymethylphenylsilane (PMPS). Further, the light emitting layer may also be made of materials in which, into these high molecular materials, high molecular materials such as perylene-based pigment, coumalin-based pigment or rhodamine-based pigment, or low molecular materials such as rubrene, perylene, 9,10-diphenylanthracene, tetraphenylbutadiene, Nile red, coumalin 6 or quinacridone are doped.

As described above, the surfaces of the spacers 14 exhibit a liquid repelling property, and thus the liquid droplets including the electro-optical material stay efficiently in the space (depression) surrounded by the spacers 14. Moreover, in the step shown in FIG. 4(a), if the surfaces of the pixel electrodes 11 upon which the liquid droplets land are made of a material having a lyophilic property, the liquid droplets ejected from the ejection slot 71 efficiently land on the surfaces of the pixel electrodes 11. Further, from the viewpoint of efficiently staying the liquid droplets in the bottom portions of the spaces divided by the spacers 14, it is preferable to form the spacers 14 by a thin film in which a first layer exhibiting a lyophilic property and a second layer exhibiting a liquid repelling property are sequentially deposited as viewed from the base substrate 10. Alternatively, the spacers 14 may be formed by forming a thin film in which a first layer made of an inorganic material, such as $SiO_2$, and a second layer made of an organic material, such as acryl or polyimide, are sequentially deposited as viewed from the base substrate 10, and a plasma treatment may be performed on the spacers 14. According to this method, the surfaces of the first layer and the second layer have different degrees of reform (the second layer exhibits higher liquid repelling property than the first layer), and thus the liquid droplets stay efficiently.

If the OLED elements 21 are formed by the above-mentioned steps, as shown in FIG. 4(d), the insulators 30 are formed in the non-pixel regions 512, and the partial insulators 22 are formed to overlap parts of the specific pixel regions 511. In forming the insulators 30 and the partial insulators 22, the liquid droplet ejection method is used. That is, liquid droplets including an insulating material are ejected suitably from an ejection slot 72 and land on the base substrate 10, such that the insulators 30 covering the overall non-pixel regions 512 and the partial insulators 22 covering the parts of the pixel regions 511 are formed. In such a manner, in the case of using the liquid droplet ejection method, the insulators 30 and the partial insulators 22 are preferably made of a material which is dispersed or dissolved to a solvent, such as water or alcohol, and has an electrically insulating property. As materials satisfying these conditions, various known materials, such as polyhydric alcohol (for example, polyvinylalcohol), acryl resin (for example, polyvinyl acetate or polyvinyl acrylate), organic silicon compounds (for example, tetraethoxysilane (TEOS) or aminopropyltrimethoxysilane) may be included. Moreover, here, an example in which the insulators 30 and the partial insulators 22 are collectively formed with one process. However, in the present invention, the insulators 30 and the partial insulators 22 are respectively formed with separate processes.

Figure 5A:
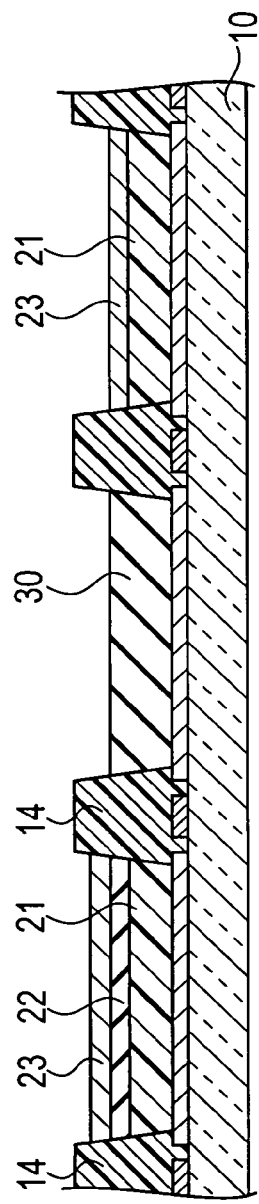
FIGS. 5(a) to 5(c) are process views showing the manufacturing method of the electro-optical device.

Subsequently, as shown in FIG. 5(a), the resistive layer 23 is formed to overlap the OLED elements 21 which are formed in the pixel regions 511. The resistive layer 23 is made of various conductive materials having a predetermined resistivity, such as semiconductor materials of polysilicon, a dispersion of 3,4-polyethylenedioxythiophene/polystyrenesulfonic acid (PEDOT/PSS) or organic silicon materials. In the case in which the resistive layer 23 is made of a semiconductor material, the resistance value is arbitrarily controlled by suitably adjusting the thickness or the injection amount of the semiconductor material. Further, the resistive layer 23 may be made of a liquid material in which minute particles made of various metallic materials, such as gold, silver, copper, palladium or nickel, or various conductive materials, such as conductive polymer or a superconductor, are dispersed. In this case, the liquid droplet ejection method is used to form the resistive layer 23. That is, the liquid droplets in which the conductive minute particles are dispersed are ejected from an ejection slot (not shown) toward the base substrate 10 and land on the surfaces of the OLED elements 21, thereby forming the resistive layer 23. In this method, the resistance value of the resistive layer 23 is controlled by suitably adjusting the dispersion amount of the conductive particles or the amount of the liquid droplets with respect to the solvent.

Figure 5B:
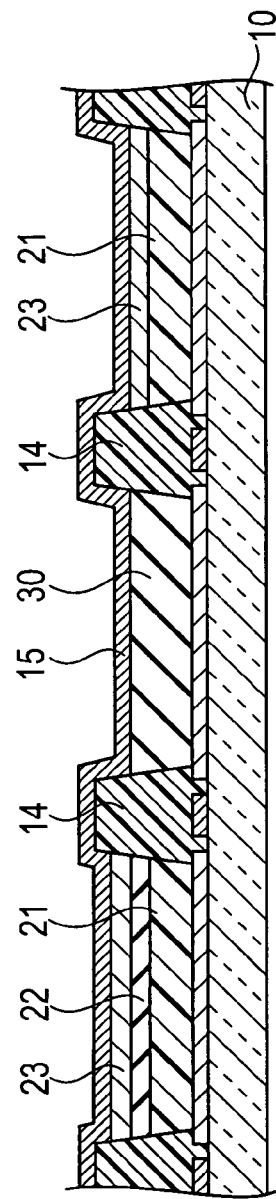

Subsequently, as shown in FIG. 5(b), the counter electrode 15 is formed to cover the entire surface of the base substrate 10 (that is, to cover the spacers 14 and the OLED elements 21 or the insulators 30). In forming the counter electrode 15, various film-forming techniques, such as vapor deposition and sputtering, are used. The counter electrode 15 is made of various conductive materials, such as a simple metallic material of aluminum, magnesium, lithium or calcium, or an alloy containing mainly the metallic material. Moreover, the counter electrode 15 may be formed by depositing a plurality of layers made of different materials. For example, the counter electrode 15 may be formed by depositing $Li_2O$ and Al, LiF and Al, or $MgF_2$ and Al. Further, in the case of the top emission type display panel 1, in order to suppress the loss of light from the OLED elements 21 toward the viewing side (the opposite side to the base substrate 10), the counter electrode 15 is made of a conductive material having a transmissive property, such as indium tin oxide.

Figure 5C:
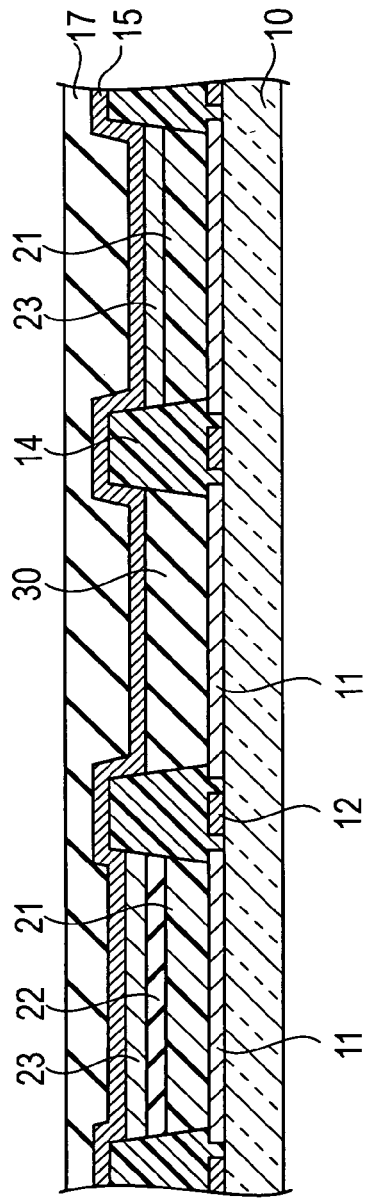

Subsequently, as shown in FIG. 5(c), the sealing layer 17 is formed to cover the entire surface of the base substrate 10. The sealing layer 17 is made of various inorganic compounds, preferably, a silicon compound, that is, silicon nitride, silicon oxide-nitride, or silicon oxide. However, the sealing layer 17 may be made of other materials, such as alumina, tantalum oxide, titanium oxide, or other ceramics. In such a manner, if the sealing layer 17 is made of the inorganic compounds, the close adherence between the sealing layer 17 and the counter electrode 15 increases when the counter electrode 15 is made of the inorganic compounds. Thus, the sealing layer 17 becomes a fine layer without defect and has better barrier property against oxygen or moisture.

Further, the sealing layer 17 may be formed by depositing a plurality of layers made of different materials selected from various silicon compounds described above. More specifically, the sealing layer may be formed by sequentially depositing a layer made of a silicon compound and a layer made of silicon oxide-nitride as viewed from the counter electrode 15 or by sequentially depositing a layer made of silicon oxide-nitride and a layer made of silicon oxide as viewed from the counter electrode 15. Meanwhile, in the top emission type display panel 1, the sealing layer 17 preferably has a transmissive property. For this reason, the light transmittance when light belonging to a visible light region is irradiated onto the sealing layer 17 is preferably set to 80 percent or more by suitably adjusting the material or the film thickness of the sealing layer 17. Further, a sealing member (not shown) may be attached to cover the entire surface of the base substrate 10 under an inert gas atmosphere. Based on this construction, if the OLED element 21 is arranged in a closed space surrounded by the sealing member and the base substrate 10, the OLED element 21 is spaced apart from atmospheric oxygen or moisture.

After the sealing layer 17 is formed, the power supply circuit 8 is mounted on the periphery of an edge of the base substrate 10, such that the electro-optical device 101 is obtained. According to the electro-optical device 101 of the present embodiment, high-quality and high-definition display is implemented, regardless of extremely simple construction (that is, regardless of a construction in which minimum elements required for displaying an image are provided) as compared with a general electro-optical device of an active matrix drive method in which a switching element, such as a thin film transistor, is provided in every pixel.

As described above, according to the present embodiment, the OLED elements 21 are formed only in the pixel regions 511 constituting the object image among the plurality of unit regions 51 in which the respective pixel electrodes 11 and the counter electrode 15 are formed. According to this construction, the step of forming the pixel electrodes 11 and the wiring lines 12, the step of forming the spacers 14, and the step of forming the counter electrode 15 and the sealing layer 17 are commonly performed, regardless of the contents of the object image. In particular, it is not necessary to change the photo mask for forming the pixel electrodes 11 according to the contents of the object image. Therefore, the cost for manufacturing the display panel 1 that displays different object images is remarkably reduced. In other words, the display panel 1 that displays various display images according to the demand of a user can be manufactured, without increasing the manufacturing costs. Besides, the present embodiment has an advantage in that the OLED elements 21, the insulators 30, and the partial insulators 22 are formed with a relatively low-priced liquid droplet ejection method.

<A-3: Modifications of First Embodiment>

Various modifications may be made from the first embodiment. The aspects of specified modifications are as follows.

Figure 6:
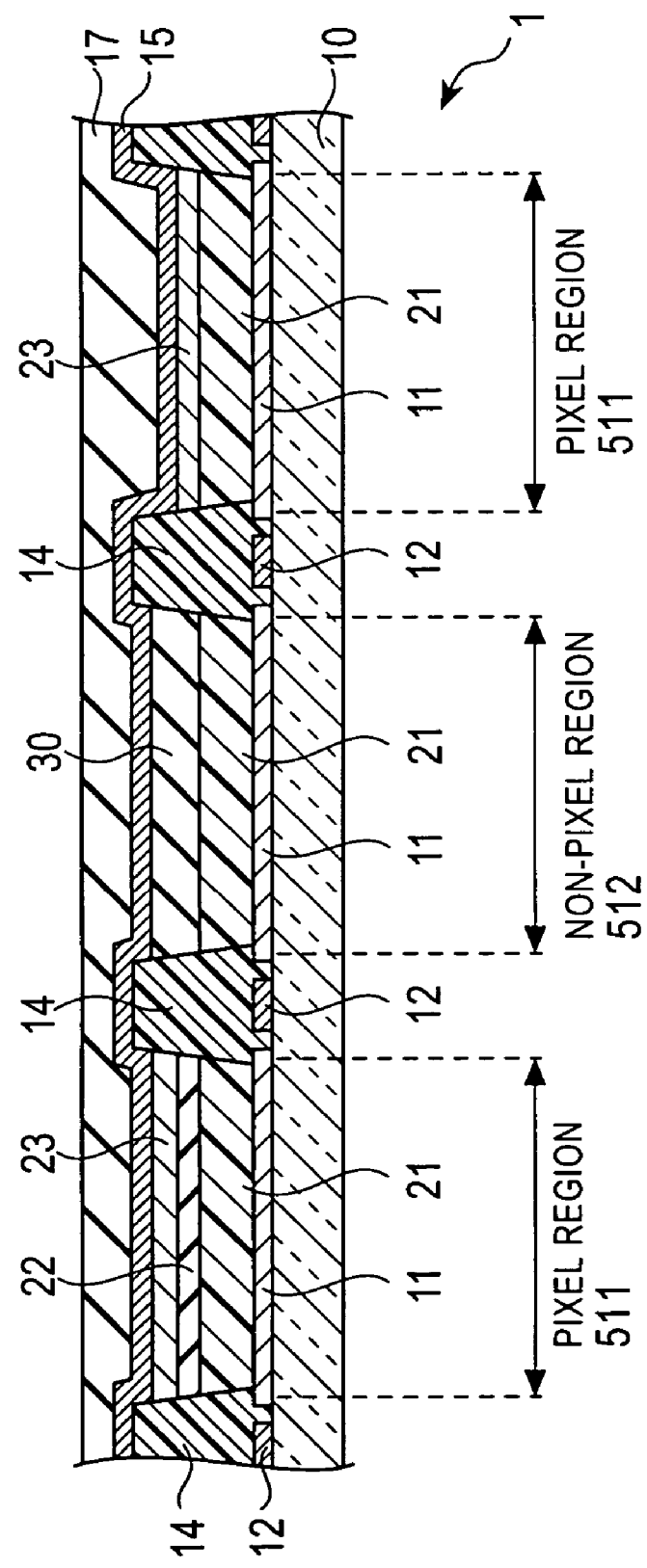
FIG. 6 is a cross-sectional view showing a construction of a display panel according to a modification.

(1) In the first embodiment, the OLED elements 21 are not provided in the non-pixel regions 512. However, a construction in which the OLED elements 21 are provided in both the pixel regions 511 and the non-pixel regions 512 may be adapted. For example, as shown in FIG. 6, the OLED elements 21 are provided in both the pixel regions 511 and the non-pixel regions 512, and the insulators 30 are formed in the non-pixel regions 512, such that the respective pixel electrodes 11 and the counter electrode 15 are electrically isolated from each other. Since a current is not supplied to the OLED elements 21 in the non-pixel regions 512, it does not contribute to the display of the object image. According to this construction, the same advantages as those in the first embodiment are also obtained. However, in order to use efficiently the materials, it is preferable that the OLED elements 21 be formed only in the pixel regions 511, and that the OLED elements 21 be not provided in the non-pixel regions 512. Further, in the case in which the insulators 30 are formed in the non-pixel regions 512 by the liquid droplet ejection method, the land positions of the liquid droplets preferably exhibit a hydrophilic property. Meanwhile, the pixel electrodes 11 generally exhibit a higher hydrophilic property than the OLED elements 21. Therefore, in order to stay efficiently the liquid droplets constituting the insulators 30, it is preferable that the land positions of the liquid droplets be set to the pixel electrodes 11, without providing the OLED elements 21 in the non-pixel regions 512.

(2) Since the optical characteristics of the OLED elements 21, in particular, the relationship between the current amount and the light emitting amount (brightness) differs for every OLED element 21 of the respective colors, the power to be supplied from the power supply circuit 8 to the respective pixel electrodes 11 is preferably different for every color of the pixel regions 511. For example, as described in the first embodiment, in the case in which the OLED elements 21 of the respective colors are arranged in a stripe shape, a construction in which electrical characteristics are made different by adjusting the sectional areas or the resistivity of the wiring lines 12 corresponding to the respective colors, or a construction in which the voltages to be applied to the wiring lines corresponding to the respective colors by the power supply circuit 8 are made different may be adapted. According to this construction, since the different voltages are applied to the respective pixel electrodes 11 corresponding to the respective colors, high-quality display fitted to the OLED elements 21 of the respective colors is implemented.

Figure 7:
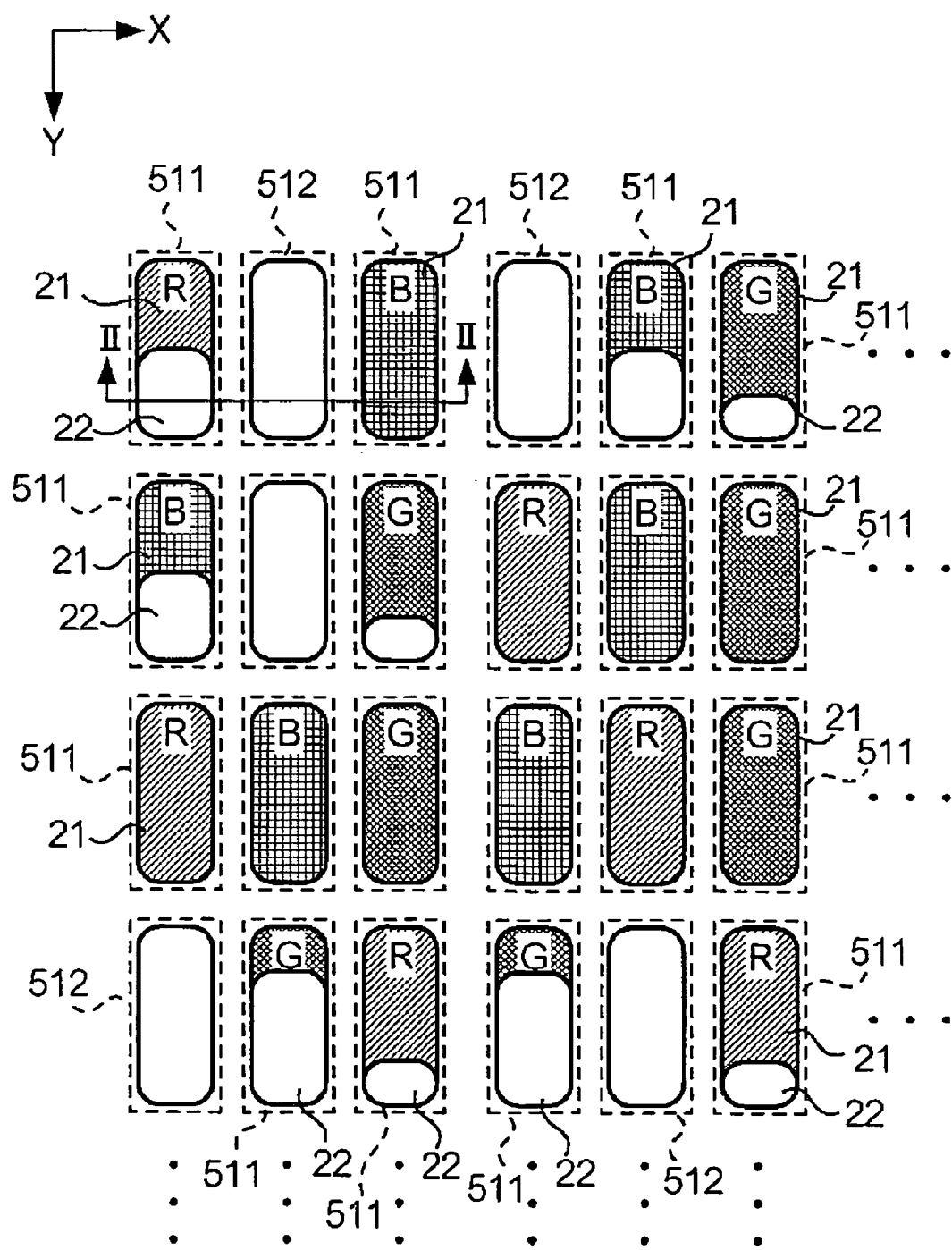
FIG. 7 is a plan view showing another aspect of the arrangement of pixel regions and non-pixel regions.
Figure 8:
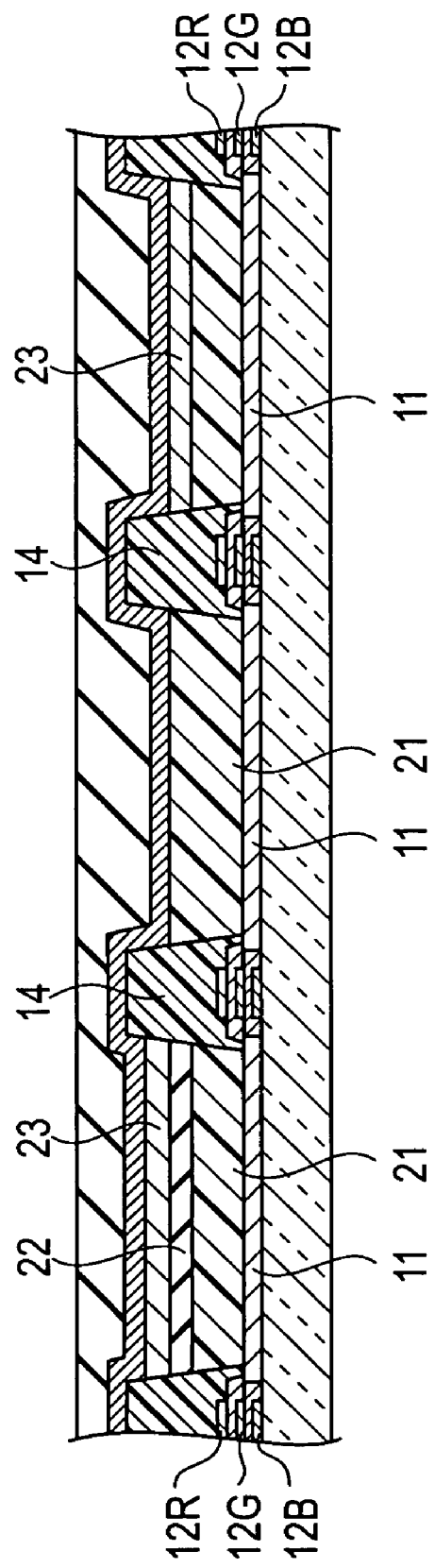
FIG. 8 is a cross-sectional view showing a construction of a display panel according to a modification.

Meanwhile, in the first embodiment, a construction in which the OLED elements 21 corresponding to the same color arranged in the Y direction is described. However, the arrangement sequence of the OLED elements 21 corresponding to the respective colors is changed arbitrarily. For example, as shown in FIG. 7, a construction in which the OLED elements 21 corresponding to the respective colors of red, green, and blue are randomly arranged may be adapted. In this construction, it is preferable that the electrical characteristics be different for the pixel electrodes 11 corresponding to the respective colors, as described above. In consideration of this matter, as shown in FIG. 8, a construction in which the plurality of wiring lines 12 (12R, 12G, and 12B) corresponding to different colors are provided is suitable. In the aspect shown in FIG. 8, in the respective gaps between adjacent unit regions 51 in the X direction, three wiring lines 12R, 12G, and 12B that are isolated from each other via an insulating layer are provided. In addition, the wiring line 12R is connected to each of the pixel regions 11 corresponding to red among the plurality of pixel regions 11 arranged in the Y direction. Further, the wiring line 12G is connected to each of the pixel regions 11 corresponding to green, and the wiring line 12B is connected to each of the pixel regions 11 corresponding to blue. In such a construction, if the electrical characteristics are different by adjusting the sectional areas or the resistivity of the wiring lines 12 corresponding to the respective colors, or the voltages to be applied to the wiring lines 12 corresponding to the respective colors by the power supply circuit 8 are different from each other, different voltages are applied to the respective pixel electrodes 11 corresponding to the respective colors.

Figure 9:
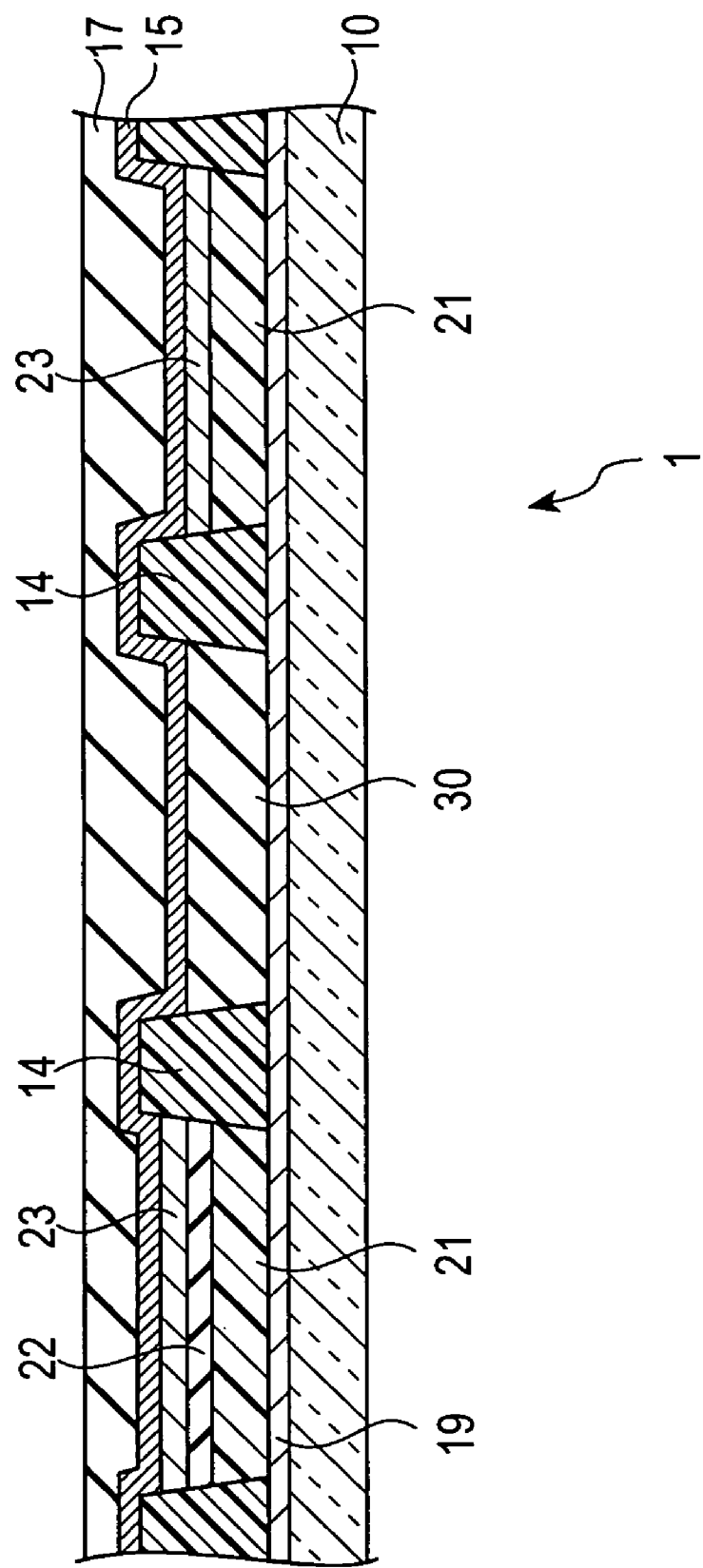
FIG. 9 is a cross-sectional view showing a construction of a display panel according to a modification.

(3) In the first embodiment, the construction in which the respective pixel electrodes 11 are formed for every unit region 51. Instead of that, as shown in FIG. 9, a construction in which a single electrode 19 extending over the plurality of unit regions 51 is formed may be adapted. The electrode 19 is connected to the power supply circuit 8. In such a construction, the power to be supplied to the OLED elements 21 of the respective pixel regions 511 is the same, and thus the brightness of the respective pixel regions 511 is arbitrarily controlled by suitably adjusting the sizes of the partial insulators 22 or the resistance value of the resistive layer 23. Further, in the first embodiment, the construction in which the resistive layer 23 is formed only in the pixel regions 511 is described. However, in the present invention, the resistive layer 23 may also be formed in the non-pixel regions 512. According to this construction, even when the respective pixel electrodes 11 and the counter electrode 15 in the non-pixel regions 512 are electrically shorted, the influence of the electrical short on the image display by the pixel regions 511 is prevented.

(4) A method of forming the OLED elements 21, the insulators 30, the partial insulators 22, and the resistive layer 23 is not limited to the liquid droplet ejection method. For example, the OLED elements 21 may be formed by a method in which the material constituting the OLED elements 21 is transcribed onto the base substrate 10 by a laser. Further, the OLED elements 21 may be formed over the entire display region by a vapor deposition method or a spin coating method. In such a manner, even when the OLED elements 21 are formed over the overall unit regions 51, various images can be displayed by suitably forming the insulators 30 or the partial insulators 22. That is, the pixel regions 511 and the non-pixel regions 512 are divided by selectively forming the insulators 30 in a part of the unit regions 51. Further, by suitably selecting the area rates of the partial insulators 22 to the pixel regions 511, the amount of light emitted from the OLED elements 21 of the respective pixel regions 511 to the viewing side (or the amount of light passing through another electro-optical material and being emitted to the viewing side) can be arbitrarily adjusted.

(5) In the first embodiment, the electro-optical device 101 in which the display of a color image is implemented by the OLED elements 21 having plural colors is described. Alternatively, the present invention can be applied to the electro-optical device 101 in which only a monochrome image is displayed using the OLED elements 21 corresponding to one color. Further, the OLED elements 21 corresponding to one color (for example, white) are provided in the respective pixel regions 511, and red, green, and blue color filters are provided in the unit regions 51 on the viewing side with respect to the OLED elements 21, such that a construction in which an color image is displayed may be adapted. Moreover, in the first embodiment, the electro-optical device 101 in which the display of the color image is implemented by the OLED elements 21 of red, green and blue is described. Alternatively, instead of or together with the OLED elements 21, OLED elements emitting light having wavelengths corresponding to other colors, such as yellow and purple, may be provided.

B: Second Embodiment

<B-1: Construction of Electro-Optical Device>

Figure 10:
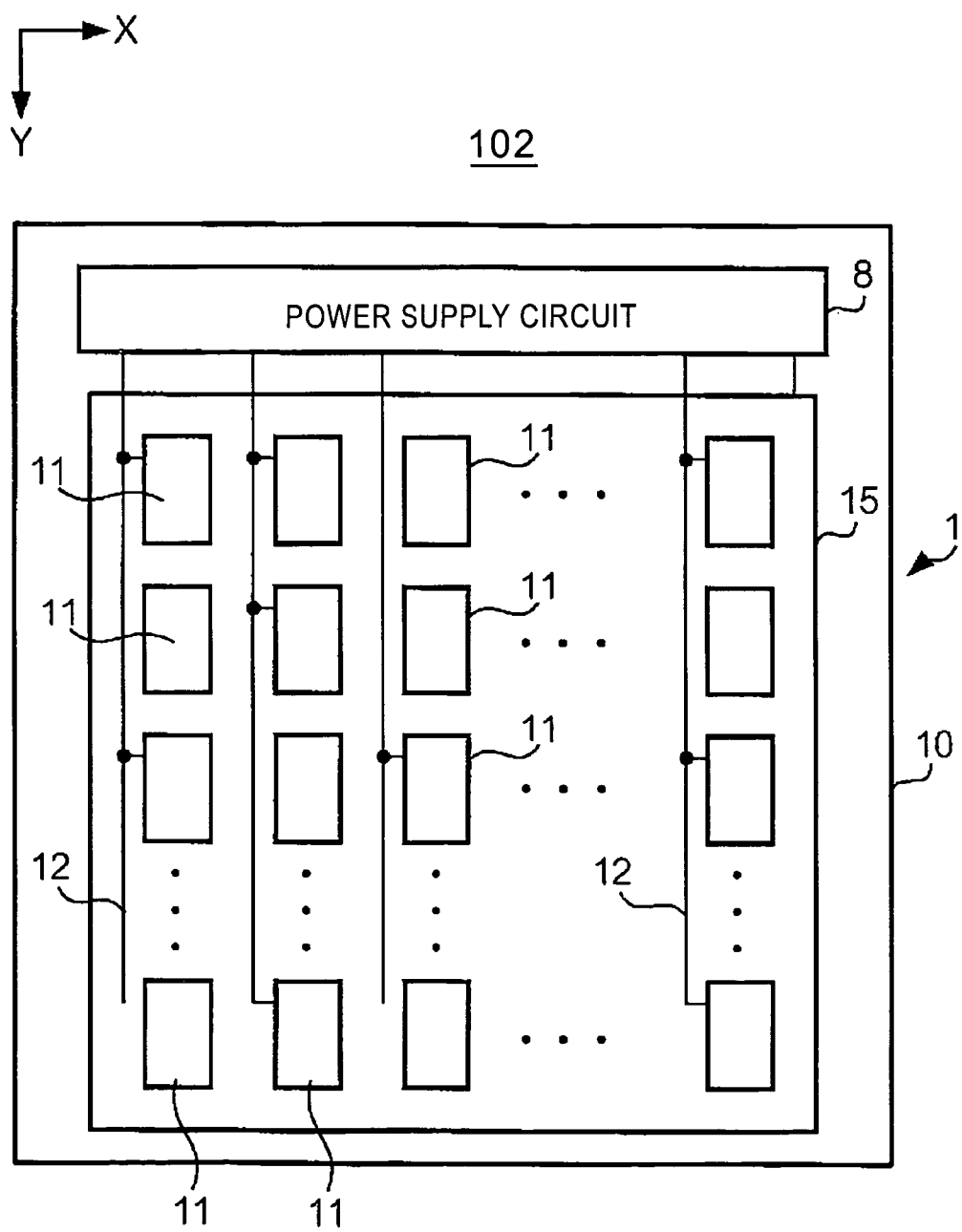
FIG. 10 is a block diagram showing a construction of an electro-optical device according to a second embodiment of the present invention.
Figure 11:
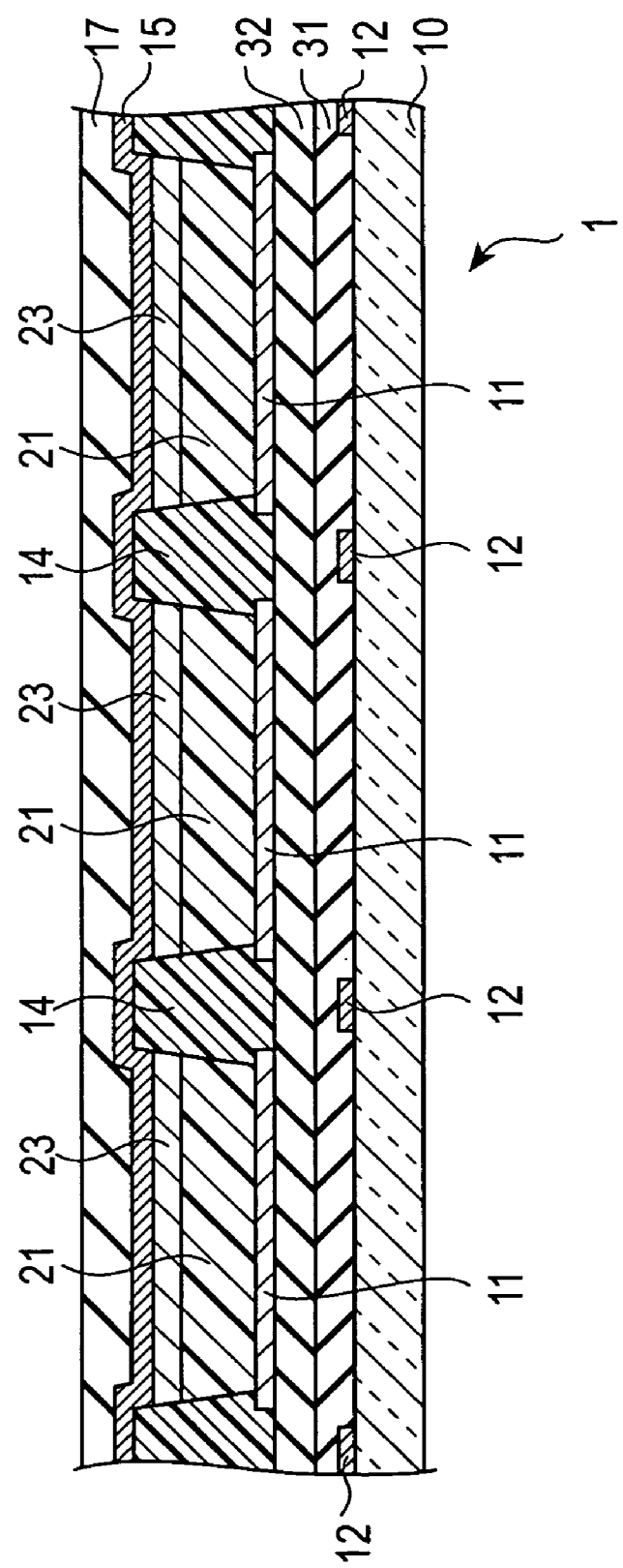
FIG. 11 is a cross-sectional view showing a construction of a display panel of the electro-optical device.

FIG. 10 is a block diagram showing a construction of an electro-optical device according to a second embodiment of the present invention. As shown in FIG. 10, an electro-optical device 102 comprises the display panel 1 and the power supply circuit 8. As shown in FIGS. 10 and 11 (a cross-sectional view of the display panel 1), the display panel 1 comprises the flat plate-shaped base substrate 10. The base substrate 10 is made of glass or plastic. The display panel 1 according to the present embodiment is a bottom emission type panel in which light generated from the OLED elements 21 passes through the base substrate 10 to a viewing side (in FIG. 11, a lower side).

On the surface of the base substrate 10, a plurality of pixel electrodes 11 are arranged in a matrix in the X direction and the Y direction. Each of the pixel electrodes 11 is a rectangular electrode to function as an anode of the OLED element 21. The respective pixel electrodes 11 are made of a conductive material having a transmissive property, such as indium tin oxide. In addition, in regions corresponding to the gaps between adjacent pixel electrodes 11 in the X direction as viewed from the direction perpendicular to the base substrate 10, the wiring lines 12 are formed. The respective wiring lines 12 extend in the Y direction, and one end of each of the wirings 12 is connected to the power supply circuit 8.

As shown in FIG. 11, the spacers 14 are formed on the surface of the base substrate 10. The spacers 14 are formed in a lattice shape so as to overlap the respective gaps between the adjacent pixel electrodes 11 in the X direction or the Y direction and project from the surface of the base substrate 10 (more specifically, the surface of a second insulating layer 32 described below). The respective wiring lines 12 overlap portions of the lattice-shaped spacers 14 extending in the Y direction, as shown in FIG. 11. Each OLED element 21 is provided to be entered into a space (depression) of which all sides are surrounded by the spacers 14 on the surface of the pixel electrodes 11. The respective OLED elements 21 have a structure in which a hole injecting layer, a hole transporting layer, a light emitting layer, an electron transporting layer, and an electron injecting layer are sequentially deposited as viewed from the side of the pixel electrode 11. The respective OLED elements 21 emit light having a wavelength corresponding to any one of red, green, and blue. On the respective OLED elements 21, the resistive layer 23 made of a conductive material having a predetermined resistivity is deposited.

The surface of the base substrate 10 on which the spacers 14 and the OLED elements 21 are provided is covered with the counter electrode 15. The counter electrode 15 is connected to the power supply circuit 8 to function as a cathode of the OLED element 21. The counter electrode 15 is opposite to the plurality of pixel electrodes 11 with the OLED elements 21 interposed therebetween. In the present embodiment, the counter electrode 15 is made of a conductive material having a reflective property, such as a simple metallic material of aluminum or silver, or an alloy mainly containing a metallic material. According to this construction, light generated from the OLED elements 21 to the opposite side (in FIG. 11, an upper side) to the viewing side is reflected toward the viewing side by the counter electrode 15. The entire surface of the base substrate 10 on which the counter electrode 15 is formed is covered with the sealing layer 17. The sealing layer 17 is a layer for protecting the respective elements formed on the base substrate 10, such as the counter electrode 15 and the like.

Meanwhile, the power supply circuit 8 is a circuit for supplying power to the respective wiring lines 12 and the counter electrode 15. In detail, the power supply circuit 8 applies a high level power supply voltage to the respective wiring lines 12 and a low level power supply voltage (a ground potential) to the counter electrode 15. As such, when a voltage is applied between the respective pixel electrodes 11 and the counter substrate 15, a current flows through the OLED elements 21, and the OLED elements 21 emit light. That is, a pixel is comprised of the pixel electrode 11, the counter electrode 15, and the OLED element 21 interposed between both electrodes. Here, in the case in which the resistive layer 23 is not provided between the respective pixel electrodes 11 and the counter electrode 15, any one of the pixel electrodes 11 and the counter electrode 15 are electrically shorted due to a cause (for example, a defect of the OLED element 21). In this case, the potential of the wiring line 12 is lowered up to the potential of the counter electrode 15, and the electrical short has an influence on other pixel electrodes 11 connected to the corresponding pixel electrode 11 via the wiring lines 12. To the contrary, in the case in which the resistive layer 23 is provided like the present embodiment, even though one pixel electrode 11 and the counter electrode 15 are electrically shorted, the influence of the electrical short on the pixels of other pixel electrodes 11 (the pixel electrodes 11 arranged in the Y direction) connected to the pixel electrode 11 via the wiring lines 12 is suppressed. Moreover, in FIG. 11, an example in which the resistive layer 23 is provided between the OLED elements 21 and the counter electrode 15 is described. However, in the present invention, a construction in which the resistive layer 23 is provided between the pixel electrode 11 and the OLED element 21 may be adapted. However, in the bottom emission type display panel 1, light generated from the OLED element 21 is emitted from the pixel electrode 11 to the viewing side via the base substrate 10. Thus, from the viewpoint of suppressing the loss of light to secure brightness, a construction in which the resistive layer 23 is arranged on the opposite side to the viewing side as viewed from the OLED element 21 as shown in FIG. 11 (that is, a construction in which light generated from the OLED element 21 is emitted toward the base substrate 10 without passing through the resistive layer 23) is preferable.

The electro-optical device 102 according to the present embodiment is a device for fixedly displaying an object image. In order to implement this display, the power from the power supply circuit 8 is supplied only to a plurality of pixels (hereinafter, referred to as 'display pixels') that are selected as ones constituting the object image composed of a number of pixels. In the present embodiment, as shown in FIG. 10, the pixel electrodes 11 of the display pixels among the plurality of pixel electrodes 11 are electrically connected to the wiring lines 12, while the pixel electrodes 11 of other pixels (hereinafter, referred to as 'non-display pixels') are electrically isolated from the wiring lines 12. In such a construction, if a voltage is applied to the wiring line 12 from the power supply circuit 8, the voltage is selectively applied only to the pixel electrodes 11 of the display pixels among the plurality of pixel electrodes 11, which are arranged along the wiring line 12 in a row, via the wiring line 12. As a result, only the OLED elements 21 of the display pixels emit light, such that the object image is displayed.

Figure 12:
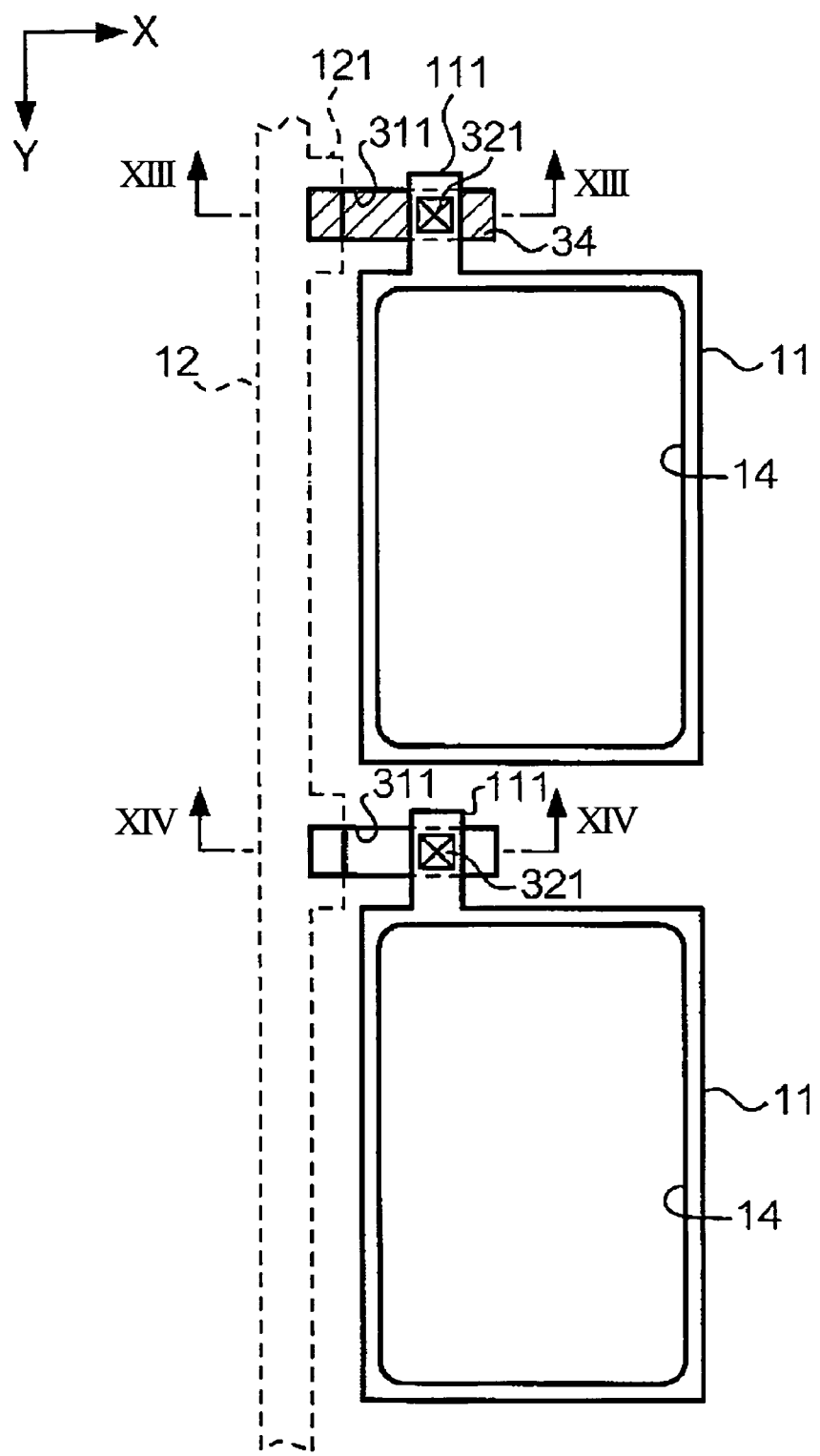
FIG. 12 is an expanded plan view showing a construction in the vicinity of a pixel electrode in the display panel.
Figure 13:
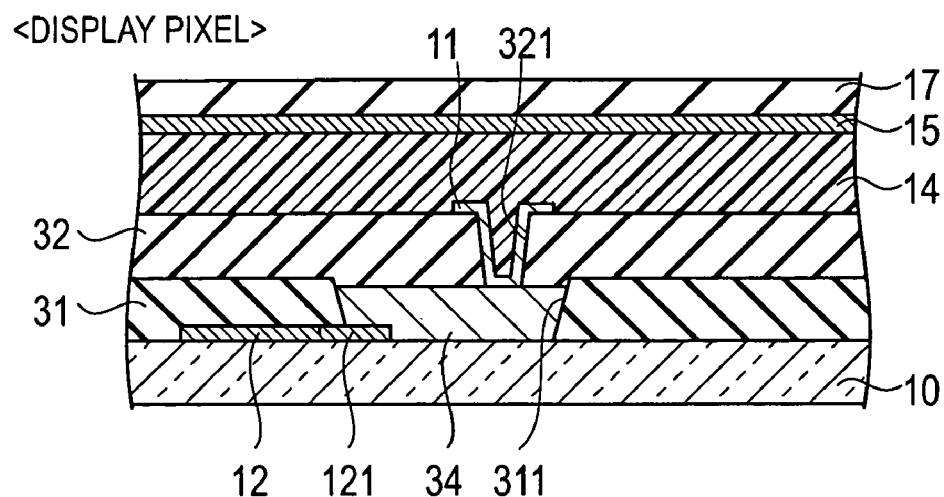
FIG. 13 is a cross-sectional view taken along the line XIII-XIII of FIG. 12, which shows a construction regarding a display pixel.
Figure 14:
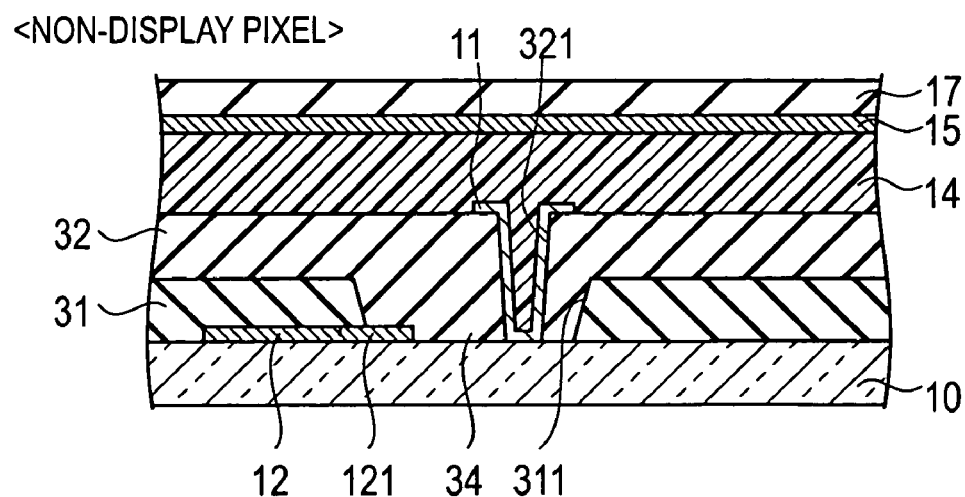
FIG. 14 is a cross-sectional view taken along the line XVI-XVI of FIG. 12, which shows a construction regarding a non-display pixel.

FIG. 12 is an enlarged plan view showing elements regarding the respective pixels. An upper pixel electrode 11 of two pixel electrodes 11 expansively shown in FIG. 12 is a pixel electrode 11 constituting the display pixel, and a lower pixel electrode 11 is a pixel electrode 11 constituting the non-display pixel. Further, FIG. 13 is a cross-sectional view taken along the line XIII-XIII of FIG. 12. FIG. 14 is a cross-sectional view taken along the line XIV-XIV of FIG. 12. As shown in FIG. 12, the respective wiring lines 12 extending in the Y direction have a projection 121 projecting toward the pixel electrode 11 (the X direction). In addition, as shown in FIGS. 13 and 14, the entire surface of the base substrate 10 on which the wiring lines 12 are formed is covered with a first insulating layer 31. The first insulating layer 31 is a film structure made of an insulating material, such as a resin material. In the first insulating layer 31, an opening portion (hereinafter, referred to as 'a connecting opening portion') 311 is formed to pass through the first insulating layer 31 in the thickness direction of the first insulating film for every pixel. As shown in FIG. 12, as viewed from the direction perpendicular to the surface of the base substrate 10, the connecting opening portion 311 has a shape extending in the X direction so as to partially overlap the projection 121 of the wiring line 12. Then, as shown in FIGS. 12 and 13, in the connecting opening portions 311 of the display pixels among the plurality of pixels, connecting portions 34 (a hatched portion in FIG. 12) are formed. The connecting portion 34 is a portion for connecting the pixel electrode 11 to the wiring line 12 (that is, the power supply circuit 8). In detail, the connecting portion 34 is formed to be entered into a space (depression) surrounded by the inner circumferential edge of the connecting opening portion 311 (that is, to fill the connecting opening portion 311), with the base substrate 10 as a bottom surface. The connecting portion 34 is made of various conductive materials, such as gold or cooper. As described above, the projection 121 of the wiring line 12 is formed to project from the inner circumferential edge of the connecting opening portion 311 to the inside, and thus the projection 121 and the connecting portion 34 provided in the connecting opening portion 311 contact each other. Meanwhile, as shown in FIGS. 12 and 14, the connecting portion 34 is not provided in the connecting opening portions 311 of the non-display pixels among the plurality of pixels.

The surface of the first insulating layer 31 is covered with the second insulating layer 32. The second insulating layer 32 is a film structure made of an insulating material, such as a resin material, similar to the first insulating layer 31. As shown in FIG. 13, portions of the second insulating layer 32 corresponding to the display pixels are formed to cover the connecting portions 34. To the contrary, as shown in FIG. 14, a portion of the second insulating layer 32 corresponding to each of the non-display pixels is provided to be entered into a space surrounded by the inner circumferential edge of the connecting opening portion 311 (that is, to fill the connecting opening portion 311), with the base substrate 10 as a bottom surface. As shown in FIG. 12, in the second insulating layer 32, an opening portion 321 passing through the second insulating layer 32 in the thickness direction is provided at a position which does not overlap the projection 121 of the wiring line 12 in a region of the connecting opening portion 311 as viewed from the direction perpendicular to the base substrate 10.

Meanwhile, the pixel electrode 11 has an extended portion 111 which projects to overlap the opening portion 321 of the second insulating layer 32. As shown in FIG. 13, the extended portion 111 of the pixel electrode 11 constituting the display pixel is entered into the opening portion 312 to reach the connecting portion 34 of the bottom surface. According to this construction, the pixel electrodes 11 constituting the display pixels are electrically connected to the wiring lines 12 and the power supply circuit 8 via the connecting portions 34. Meanwhile, as shown in FIG. 14, since the connecting portions 34 are not provided in the non-display pixels, the extended portions 111 of the pixel electrodes 11 constituting the non-display pixels are entered into the respective opening portions 321 to reach the surface of the base substrate 10. Therefore, the pixel electrodes 11 constituting the non-display pixels become an electrically isolated state from the wiring lines 12 by the second insulating layer 32. The construction of layers above the pixel electrodes 11 are as described with reference to FIG. 11. In such a manner, the display pixels and the non-display pixels are different from each other only in the presence or absence of the connecting portions 34.

<B-2: Manufacturing Method of Electro-Optical Device>

Next, a manufacturing method of the above-mentioned electro-optical device 102 will be described. Hereinafter, a step of forming the wiring lines 12 up to a step of forming the pixel electrodes 11 will be described with reference to FIGS. 15(a) to 15(e) that correspond to the cross-sectional view of FIG. 13. Meanwhile, the steps of the formation of the spacers 14 up to the completion of the electro-optical device 102 will be described with reference to FIGS. 16(a) to 16(d) that correspond to the cross-sectional view of FIG. 11.

Figure 15A:
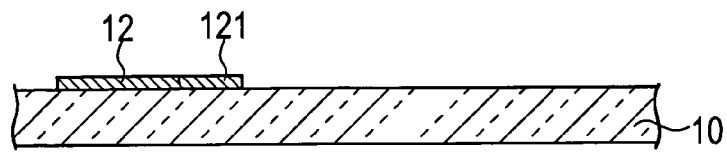
FIGS. 15(a) to 15(e) are process views showing a manufacturing method of the electro-optical device.
Figure 15B:
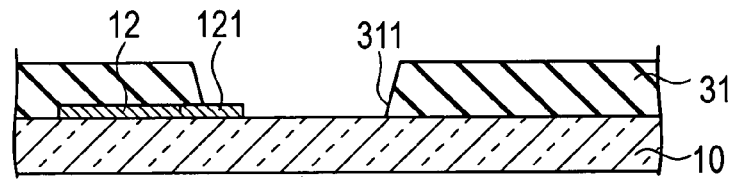

To begin with, as shown in FIG. 15(a), the wiring lines 12 having the projections 121 are formed on the surface of the base substrate 10. More specifically, a conductive thin film made of aluminum, silver, or copper is formed with a film-forming technique, such as a sputtering method, and a patterning process is performed on the thin film using a photolithography technique, such that the wiring lines 12 are obtained. Subsequently, as shown in FIG. 15(b), the first insulating layer 31 having the connecting opening portions 311 is formed to cover the surface of the base substrate 10. Specifically, a photosensitive organic material, such as polyimide, acryl, or polyamide, is applied on the base substrate 10 and is then hardened by heating. Then, an exposure and a development are performed on the thin film using a predetermined photo mask, such that the first insulating layer 31 is obtained.

Figure 15C:
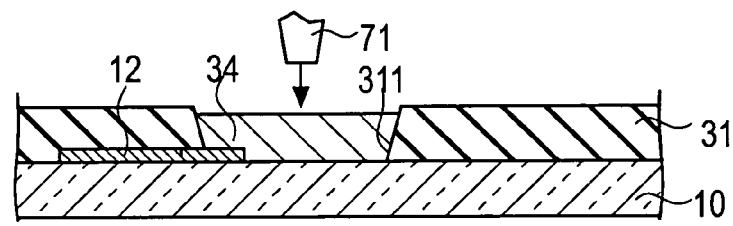

Subsequently, as shown in FIG. 15(c), the connecting portions 34 are selectively formed to ones corresponding to the display pixels among the plurality of connecting opening portions 311 provided in the first insulating layer 31. In forming the connection portions 34, the liquid droplet ejection method (the ink jet method) is used. That is, as shown in FIG. 15(c), the ejection slot 71 moves above the connecting opening portions 311 corresponding to the display pixels among the plurality of the connecting opening portions 311, and then the liquid droplets including a conductive material are ejected from the ejection slot 71 and land on the connecting opening portions 311. After this step is repeated to all the display pixels, the liquid droplets are dried, such that the connecting portions 34 are selectively formed only in the display pixels. The liquid droplets constituting the connecting portions 34 are not ejected onto the connecting opening portions 311 of the non-display pixels. Moreover, in this step, the material of the liquid droplets to be ejected from the ejection slot 71 may include one in which minute particles (hereinafter, referred to as 'conductive particles') made of various conductive materials, such as a metallic material (for example, gold, silver, copper, palladium, or nickel), conductive polymer, or a superconductor, are dispersed into a liquid solution, such as water. Since the conductive particles are ejected from the ejection slot 71, the diameter of each of the conductive particles is preferably in the range of 50 nm (nanometer) to 0.1 μm (micrometer). Further, in order to disperse efficiently the conductive particles in the liquid solution, the surfaces of the respective conductive particles may be coated with an organic material. For example, xylen is added into toluene in which gold particles having a diameter of about 10 nm are dispersed, and then the liquid is ejected from the ejection slot 71 at a viscosity of about 3 cP (centipoise), such that the connecting portions 34 are formed.

Figure 15D:
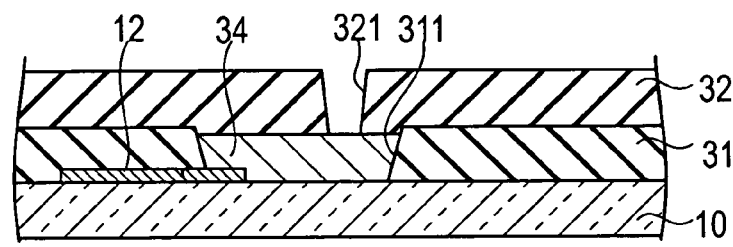
Figure 15E:
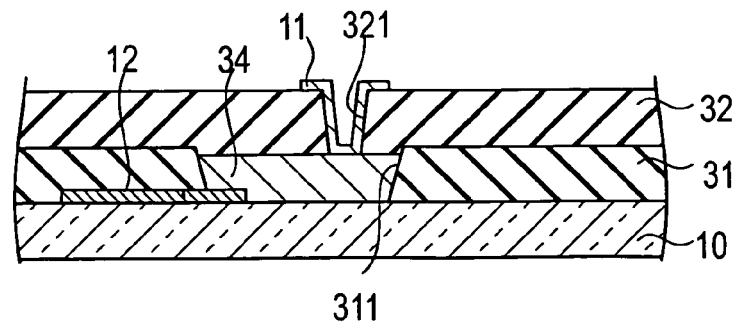

Next, as shown in FIG. 15(d), the second insulating layer 32 having the opening portions 321 is formed to cover the surface of the first insulating layer 31. The second insulating layer 32 is formed with the common material in the same step as that of the first insulating layer 31. In addition, as shown in FIG. 15(e), the pixel electrodes 11 having the extended portions 111 are formed on the surface of the second insulating layer 32 so as to correspond to each of the display pixels and the non-display pixels. The pixel electrodes 11 is obtained by forming a thin film having a conductive property and a transmissive property, made of indium tin oxide, indium oxide or zinc oxide-based amorphous, with a film-forming technique, such as a sputtering method, and by performing a patterning process using a photolithography technique to the thin film. The extended portions 111 of the resultant pixel electrodes 11 are respectively entered into the opening portions 321 of the second insulating layer 32 to contact the connecting portions 34 in the respective display pixels. Further, in the non-display pixels, the extended portions 111 of the pixel electrodes 11 reach the surface of the base substrate 10 via the respective connecting opening portions 311 of the first insulating layer 31. Moreover, in the case in which the display panel 1 is a top emission type, it is not necessary for the pixel electrodes 11 to have a transmissive property. Thus, the pixel electrodes 11 may be made of a conductive material having a reflective property (or a conductive material not having a transmissive property), such as a simple metallic material of aluminum or silver, or an alloy containing mainly the metallic material.

Figure 16A:
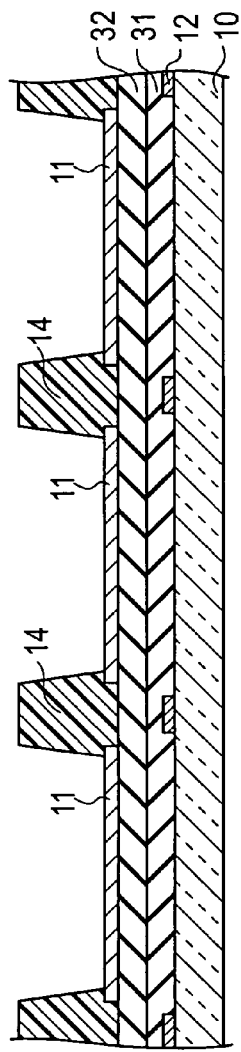
FIGS. 16(a) to 16(d) are process views showing the manufacturing method of the electro-optical device.
Figure 16B:
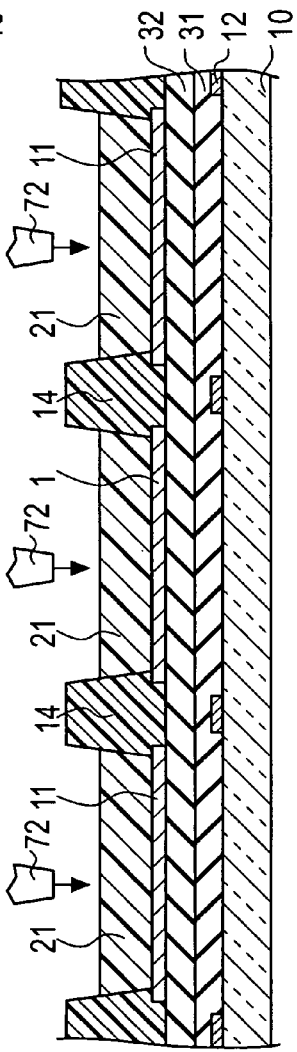

Subsequently, as shown in FIG. 16(a), the spacers 14 are formed on the surface of the second insulating layer 32. The material or forming method of the spacers is the same as that of the first embodiment. Subsequently, as shown in FIG. 16(b), the OLED elements 21 are respectively formed in the plurality of regions which are divided by the spacers 14. In forming the OLED elements 21, the liquid droplet ejection method (the ink jet method) is used. That is, as shown in FIG. 16(b), the ejection slot 72 moves above the regions in which the OLED elements 21 are to be formed, and the liquid droplets including the electro-optical material are ejected from the ejection slot 72 and land on the surfaces of the pixel electrodes 11. This step is repeated to all the pixels, and the liquid droplets are dried, such that the OLED elements 21 are obtained. The materials or the forming methods of the respective layers constituting the respective OLED elements 21 are as described in the first embodiment.

Figure 16C:
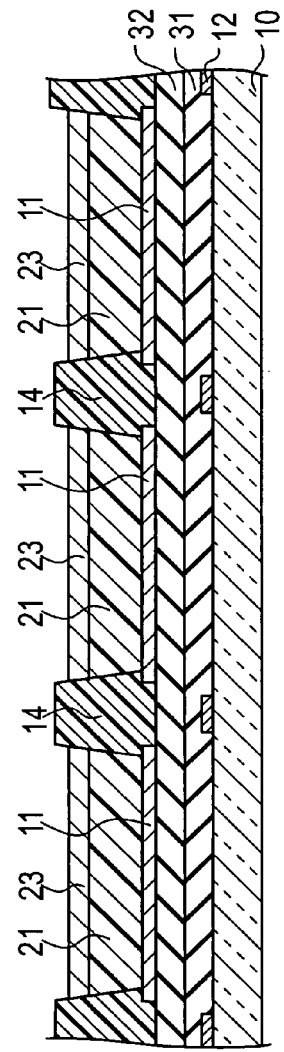
Figure 16D:
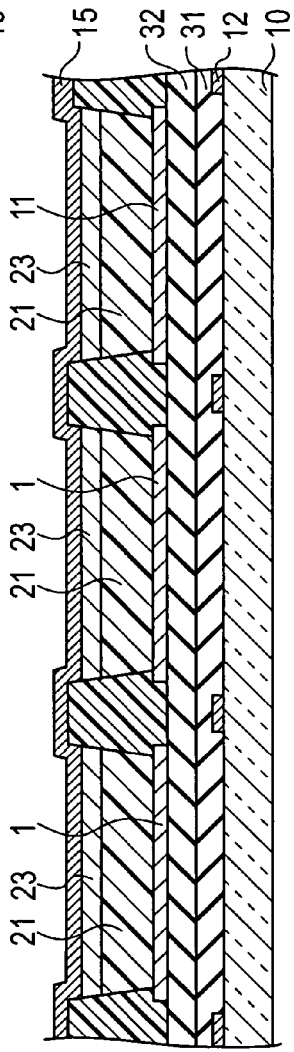

Subsequently, as shown in FIG. 16(c), the resistive layer 23 is formed to overlap the respective OLED elements 21. The material or the forming method of the resistive layer 23 is the same as that of the first embodiment. Subsequently, as shown in FIG. 16(d), by the same material and sequence as those of the first embodiment, the counter electrode 15 is formed to cover the entire surface of the base substrate 10 (that is, to cover the spacers 14 and the OLED elements 21). And then, by the same material and sequence as those of the first embodiment, the sealing layer 17 for covering the entire surface of the base substrate 10 is formed (see FIG. 11).

In such a manner, after the sealing layer 17 is formed, the power supply circuit 8 is mounted on the periphery of an edge of the base substrate 10, such that the electro-optical device 102 is obtained. According to the electro-optical device 102 of the present embodiment, high-quality and high-definition display is implemented, regardless of an extremely simple construction (that is, regardless of a construction in which minimum elements required for displaying an image are provided) as compared with a general electro-optical device of an active matrix drive method in which a switching element, such as a thin film transistor, is provided in every pixel.

As described above, according to the present embodiment, only the pixel electrodes 11 corresponding to the pixels constituting the object image among the plurality of pixel electrodes 11 are selectively connected to the power supply circuit 8 via the connecting portions 34. Therefore, by suitably selecting the presence or absence of the formation of the connecting portions 34 according to the contents of the object image, the electro-optical device 102 that displays a desired object image is obtained. For this reason, the steps of forming the respective elements, such as the pixel electrodes 11 or the OLED elements 21, on the base substrate 10 are commonly performed, regardless of the contents of the object image. In particular, it is not necessary to change the photo mask for forming the pixel electrodes 11 according to the contents of the object image. Therefore, the costs for manufacturing the display panel 1 that displays different object images is remarkably reduced. In other words, the display panel 1 that displays various object images according to the demand of the user can be manufactured without increasing the manufacturing costs. Besides, the present embodiment has an advantage in that the connecting portions 34 are formed with a relatively low-priced liquid droplet ejection method.

C: Third Embodiment

Figure 17:
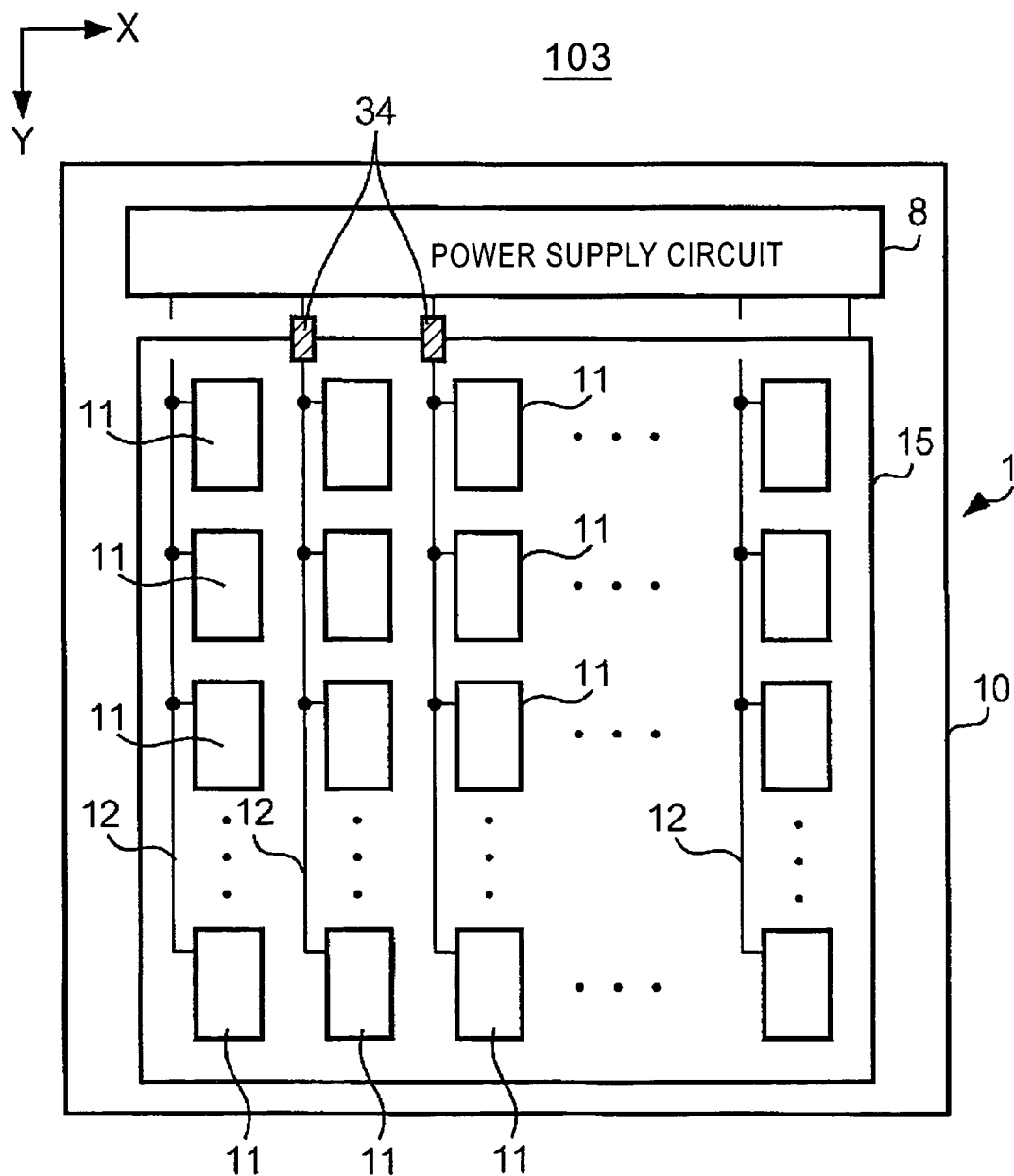
FIG. 17 is a block diagram showing a construction of an electro-optical device according to a third embodiment of the present invention.

Next, an electro-optical device according to a third embodiment of the present invention will be described. In the above-mentioned second embodiment, the construction in which only the pixel electrodes 11 constituting the display pixels among the pixel electrodes 11 are selectively connected to the wiring lines 12 is described. To the contrary, in the electro-optical device 103 according to the present embodiment, as shown in FIG. 17, all the pixel electrodes 11 are connected to the wiring lines 12. Meanwhile, only the wiring lines 12 (hereinafter, referred to as 'display wiring lines') which are connected to the pixel electrodes 11 constituting the display pixels among the wire lines 12 are selectively connected to the power supply circuit 8 via the connecting portions 34. According to this construction, the plurality of pixels arranged in the Y direction emits light, such that the object image is displayed.

Figure 18:
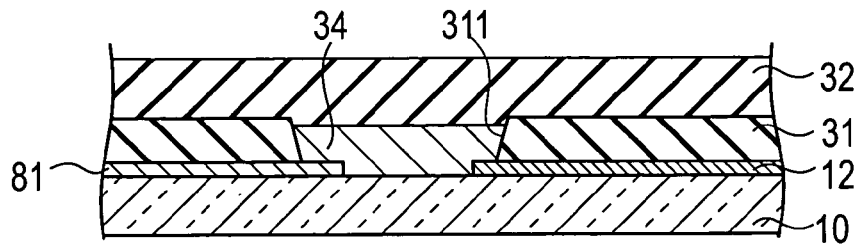
FIG. 18 is a cross-sectional view of a display panel of the electro-optical device, which shows a construction regarding a display wiring line.
Figure 19:
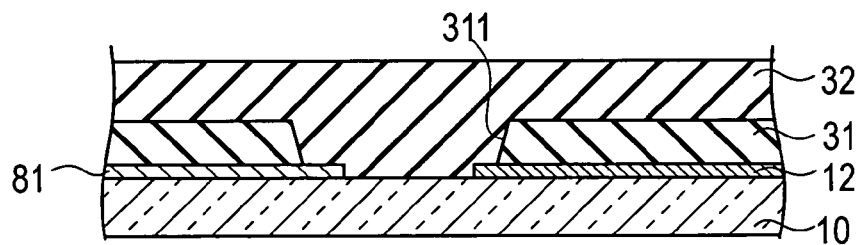
FIG. 19 is a cross-sectional view of the display panel, which shows a construction regarding a non-display wiring line.

FIG. 18 is a cross-sectional view showing the relationship between the display wiring line 12 and a wiring line (hereinafter, referred to as 'a power supply wiring line') 81 extending from the power supply circuit 8. FIG. 19 is a cross-sectional view showing the relationship between wiring lines 12 (hereinafter, referred to as 'non-display wiring lines') other than the display wiring lines among the plurality of wiring lines 12 and the power supply wiring lines 81. As shown in FIGS. 18 and 19, in the periphery of the region of the base substrate 10 on which the power supply circuit 8 is mounted, one ends of the power supply wiring lines 81 and one ends of the wiring lines 12 to which the pixel electrodes 11 arranged in the Y direction are commonly connected are respectively spaced apart from each other in the state of facing each other.

Figure 20:
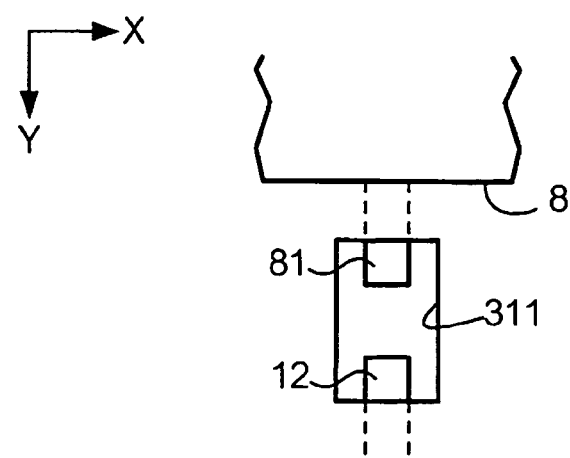
FIG. 20 is an expanded plan view showing a power supply wiring line and a wiring line of the display panel.

The surface of the base 10 on which the power supply wiring lines 81 and the wiring lines 12 are formed is covered with the first insulating layer 31. In the portions of the first insulating layer 31 at which the ends of the power supply wiring lines 81 and the ends of the wiring lines 12 are respectively close to each other, the connecting opening portions 311 passing through the first insulating layer 31 in the thickness direction are formed. Here, FIG. 20 is an enlarged plan view showing a portion at which the power supply wiring line 81 and the wiring line 12 are close to each other. As shown in FIG. 20, as viewed from the direction perpendicular to the surface of the base material 10, an end of the power supply wiring line 81 and an end of the wiring line 12 project from the inner circumferential edge of the connecting opening portion 311 to reach the inside of the connecting opening portion 311. And then, as shown in FIG. 18, the connecting portions 34 are formed in the connecting opening portions 311 corresponding to the display wiring lines 12 among the plurality of wiring lines 12. The connecting portion 34 is made of various conductive materials. In detail, the connecting portion 34 is formed to be entered into a space (depression) surrounded by the connecting opening portion 311 (that is, to fill the connecting opening portion 311) with the base substrate 10 as the bottom surface. As described above, the respective ends of the power supply wiring line 81 and the wiring line 12 are provided to project from the inner circumferential edge of the connecting opening portion 311 to the inside. The display wiring lines 12 are connected to the power supply wiring lines 81 via the connecting portions 34. To the contrary, as shown in FIG. 19, the connecting portions 34 are not provided in the connecting opening portions 311 corresponding to the non-display wiring lines 12. Therefore, the non-display wiring lines 12 are electrically isolated from the power supply circuit 8. The surface of the first insulating layer 31 is covered with the second insulating layer 32. In such a construction, if a voltage is applied from the power supply circuit 8 to the power supply wiring lines 81, the voltage is selectively applied only to the pixel electrodes 11 which are arranged along the respective display wiring lines 12 among the plurality of wiring lines 12. As a result, the OLED elements 21 of the display pixels (that is, the pixels connected to the display wiring lines 12) emit light, such that an object image is displayed. Moreover, the first insulating layer 31, the second insulating layer 32, and the connecting portions 34 in the present embodiment are respectively formed with the same material and step as the first insulating layer 31, the second insulating layer 32, and the connecting portions 34 in the second embodiment. For example, the connecting portions 34 are obtained by ejecting the liquid droplets including the conductive material from the ejection slot 71 and by putting inside the connecting opening portions 311.

Meanwhile, the relationships between the respective pixels and the wiring lines 12 are common regardless of the display pixel or the non-display pixel. That is, the opening portions are provided in the first insulating layer 31 and the second insulating layer 32 which cover the wiring lines 12 formed on the base substrate 10, and the pixel electrodes 11 provided on the surface of the second insulating layer 32 are connected to the wiring lines 12 via the opening portions. The construction of the upper layers above the pixel electrodes 11 is the same as that in the second embodiment.

As described above, according to the present embodiment, by suitably selecting the presence or absence of the formation of the connecting portions 34 according to the contents of the object image, the electro-optical device 103 that displays a desired object image is obtained. Thus, similar to the second embodiment, the cost for manufacturing the display panel 1 that displays different object images is remarkably reduced. Moreover, in the present embodiment, since the presence or absence of the connection of the wiring lines 12 and the power supply wiring lines 81 is selected, it is impossible to distinguish connection or non-connection to each of the plurality of pixels which are connected to the common wiring line 12. However, in such a construction, by making the resistance value of the resistive layer 23 different for every pixel, it is possible to perform high-definition display by multi-level grayscale. Further, in the present embodiment, an example in which all the pixel electrodes 11 arranged in the Y direction are connected to the wiring lines 12 is described. However, in the present invention, by the construction similar to the second embodiment, it is possible to distinguish the connection or non-connection of the respective pixel electrodes 11 to the display wiring lines 12 according to the contents of the object image.

D: Fourth Embodiment

Next, an electro-optical device according to a fourth embodiment of the present invention will be described. In the second embodiment and the third embodiment, the construction in which the presence or absence of the connection of the respective pixel electrodes 11 and the power supply circuit 8 is suitably distinguished is described. To the contrary, in the present embodiment, each of the plurality of pixel electrodes 11 is electrically connected to the power supply circuit 8. Meanwhile, the resistance values between the respective pixel electrodes 11 and the power supply circuit 8 are suitably selected according to the contents of the object image.

Figure 21:
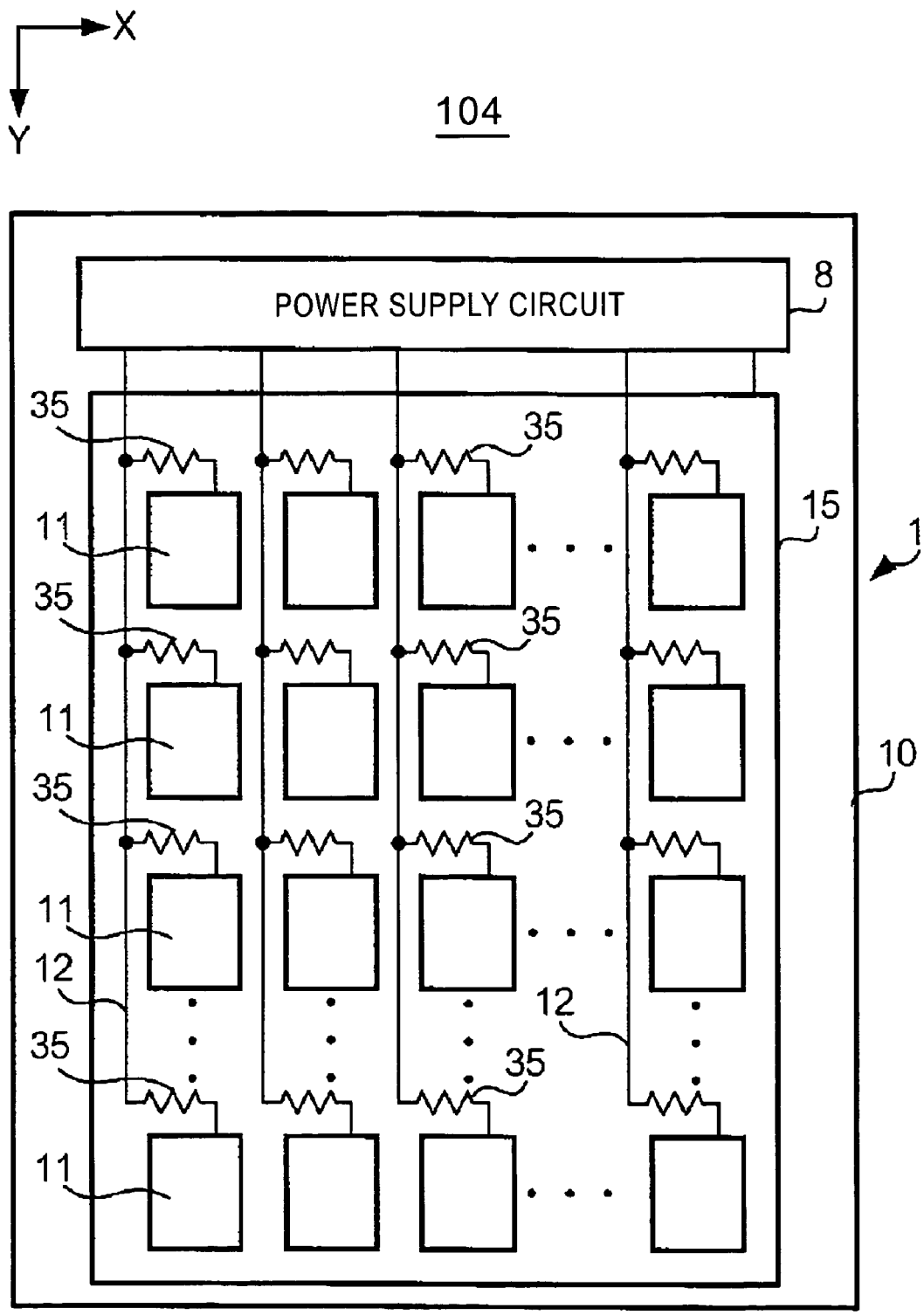
FIG. 21 is a block diagram showing a construction of an electro-optical device according to a fourth embodiment of the present invention.

FIG. 21 is a block diagram showing a construction of the electro-optical device 104 according to the present embodiment. As shown in FIG. 21, each of the plurality of pixel electrodes 11 which are arranged in a matrix on the base substrate 10 is connected to the wiring lines 12 via resistors 35. The respective wiring lines 12 extend in the Y direction and connect to the power supply circuit 8. The resistance values of the respective resistors 35 are suitably selected according to the contents of the object image. More specifically, the resistance values of the resistors 35 which are connected to the pixel electrodes 11 of the pixels having high brightness in the object image are lower than the resistance values of the resistors 35 connected to the pixel electrodes 11 of the pixels having low brightness. According to this construction, a voltage to be applied to the pixel electrodes 11 which are connected to the resistors 35 having a low resistance value is higher than the voltage to be applied to the pixel electrodes 11 which are connected to the resistors 35 having a high resistance value. Therefore, the brightness of the pixels comprised of the pixel electrodes 11 which are connected to the resistors 35 having a low resistance value becomes higher than the brightness of the pixels comprised of the pixel electrodes 11 which are connected to the resistors 35 having a high resistance value. As a result, an object image is displayed with multi-level grayscale.

Figure 22:
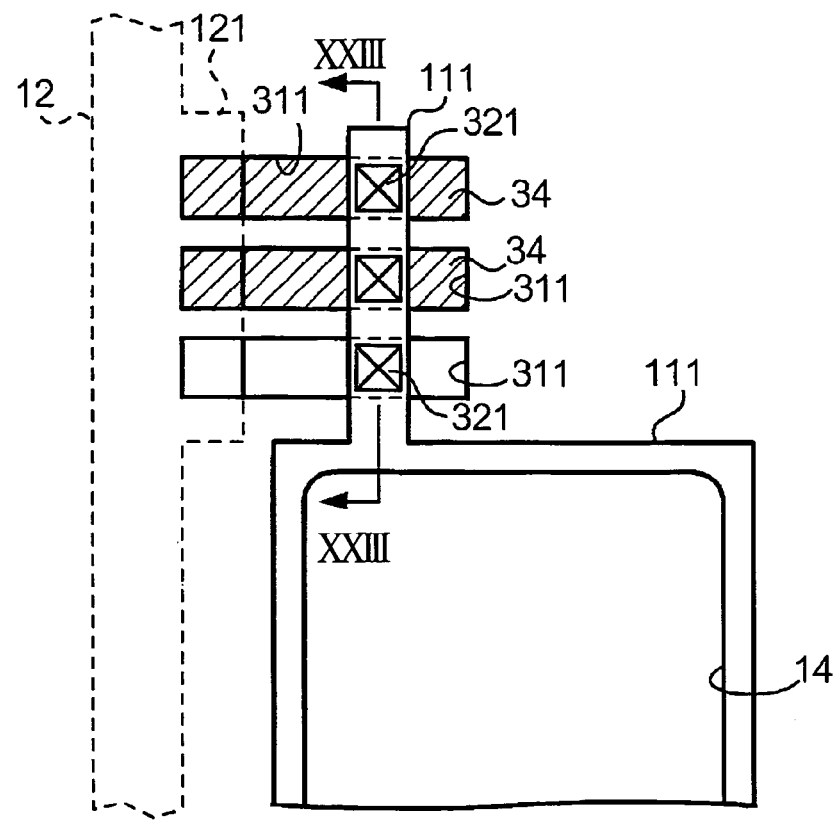
FIG. 22 is an expanded plan view showing a construction in the vicinity of a pixel electrode in the display panel of the electro-optical device.
Figure 23:
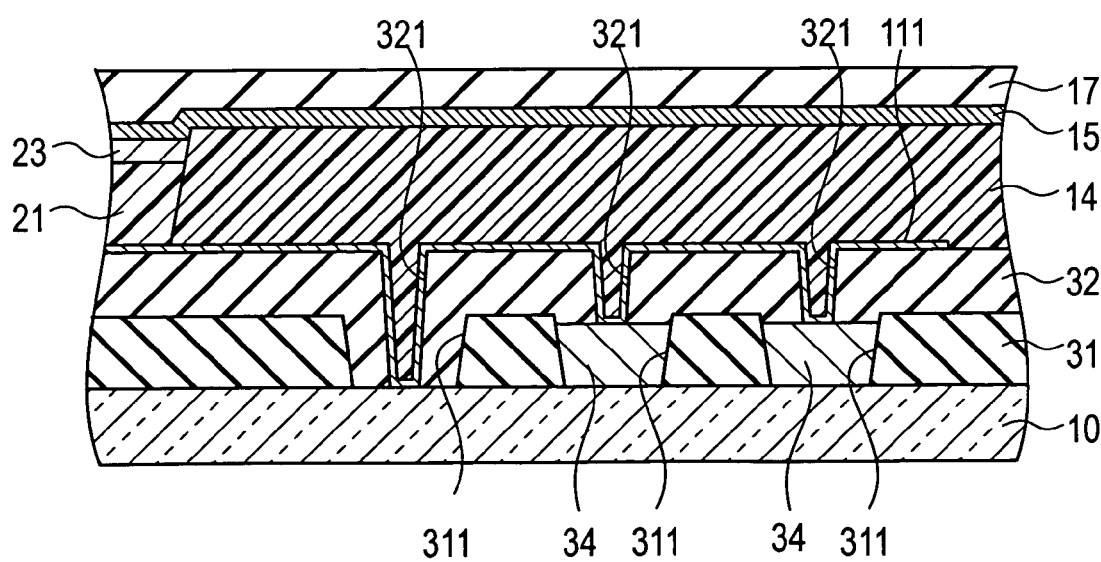
FIG. 23 is a cross-sectional view taken along the line XXIII-XXIII of FIG. 22.

FIG. 22 is an enlarged plan view showing elements regarding the pixel. FIG. 23 is a cross-sectional view taken along the line XXIII-XXIII of FIG. 22. As shown in FIGS. 22 and 23, the construction in the periphery of the pixel electrodes 11 in the present embodiment is common to the electro-optical device 102 of FIG. 12 in that the wiring lines 12 formed on the surface of the base substrate 10 are covered with the first insulating layer 31 and the second insulating layer 32 and that the pixel electrodes 11 are formed such that the extended portions 111 are entered into the opening portions 321 of the second insulating layer 32. Meanwhile, the construction of the present embodiment is different from the electro-optical device 102 in that three connecting opening portions 311 are formed with respect to one pixel. In the present embodiment, the connecting portions 34 (in FIG. 22, hatched portions) are selectively formed to one to three connecting opening portions 311 selected according to the brightness of the object image among three connecting opening portions 311. Each connecting portion 34 is a portion for connecting the pixel electrode 11 to the wiring line 12 (that is, the power supply circuit 8). In FIG. 22, the construction in which the connecting portions 34 are formed only in two connecting opening portions 311 disposed on the upper side in the drawing. Meanwhile, in one connecting opening portion 311 disposed on the lower side in the drawing, the connecting portion 34 is not formed as shown in FIG. 23. Therefore, the pixel electrode 11 and the wiring line 12 (that is, the power supply circuit 8) are electrically connected to each other via only two connecting portions 34. In such a manner, by determining the number of connecting portions 34 for connecting the pixel electrode 11 to the wiring line 12 according to the contents of the object image for every pixel, the resistance value between the pixel electrode 11 and the wiring line 12 is adjusted. For example, the resistance value between the pixel electrode 11 and the wiring line 12 when the connecting portions 34 are provided at three connecting opening portions 311 is lower than the resistance value between the pixel electrode 11 and the wiring line 12 when the connecting portion 34 is provided at one connecting opening portion 311. That is, the resistors 35 shown in FIG. 21 correspond to the connecting portions 34 of which the number is selected according to the contents of the object image. Moreover, the electro-optical device 104 is manufactured by the method described with reference to FIGS. 15(a) to 15(e) and FIGS. 16(a) to 16(d). However, in the step shown in FIG. 15(b), three connecting opening portions 311 are formed for one pixel. Further, in the step shown in FIG. 15(c), the liquid droplets including a conductive material are ejected from the ejection slot 71 to the connecting opening portions 34 of which the number is determined according to the contents of the object image, such that the connecting portions 34 are formed.

As described above, in the present embodiment, the resistors 35 of which the resistance values are selected according to the contents of the object image (more specifically, the grayscale levels of the respective pixels constituting the object image) are provided to be interposed between the respective pixel electrodes 11 and the power supply circuit 8. Therefore, the steps forming various elements, such as the pixel electrodes 11, are commonly performed regardless of the contents of the object image. As a result, according to the present embodiment, similar to the second embodiment and the third embodiment, the cost for manufacturing the display panel 1 that displays different object images is reduced.

E: Modifications of Second to Fourth Embodiments

Various modifications can be made from the second to fourth embodiments. The aspects of specified modifications are as follows.

(1) The constructions shown in the second to fourth embodiments are suitably combined. For example, in the fourth embodiment, the connecting portions 34 may be not formed in any one of three connecting opening portions 311 with respect to the non-display pixels which do not constitute the object image, and the respective pixel electrodes 11 and the power supply circuit 8 in the non-display pixels may be electrically isolated from each other, similar to the second embodiment. Further, as described in the third embodiment, the plurality of connecting opening portions 311 shown in the fourth embodiment may be provided between the power supply wiring lines 81 of the power supply circuit 8 and the wiring lines 12. And then, by selectively providing the connecting portions 34 in a part of the plurality of connecting opening portions 311 or all the connecting opening portions 311, the resistance values between the respective wiring lines 12 and the power supply circuit 8 may be different according to the contents of the object image.

(2) In the fourth embodiment, the construction in which three connecting opening portions 311 are formed. However, the number of the connecting opening portions 311 for every pixel is arbitrary. The more the number of the connecting opening portions 311 is, the more the voltage to be applied to the pixel electrode 11 is diversified. Thus, the object image having more multi-level grayscale can be displayed. Further, in the fourth embodiment, the construction in which the resistance value between the pixel electrode 11 and the power supply circuit 8 is adjusted according to the number of the connecting portions 34 is described. However, in the present invention, a construction in which the resistance values themselves of the connecting portions 34 are different according to the contents of the object image can be adapted. For example, the connecting portions 34 are formed with a plurality of conductive materials having different resistivity, such that the resistance values of the connecting portions 34 of the respective pixels may be different. In addition, in the case in which the connecting portions 34 are formed with the liquid droplet ejection method, the resistance values of the connecting portions 34 of the respective pixels are made different by suitably adjusting the concentration or the contents of the conductive materials contained in the liquid droplets.

(3) The method for forming the connecting portions 34 or the OLED elements 21 is not limited to the liquid droplet ejection method. For example, the OLED elements 21 may be formed by a method in which a material constituting the elements is transcribed onto the base substrate 10 by a laser. Further, the OLED elements 21 may be formed over the entire display region by a vapor deposition method or a spin coating method. In such a manner, even when the OLED elements 21 are formed over the entire surface of the base substrate 10, various images are displayed by selectively forming the connecting portions 34. That is, the display pixels and the non-display pixels are distinguished by selectively forming the connecting portions 34 to the specific pixels. The amount of light emitted from the display pixels to the viewing side (or the amount of light passing through another electro-optical material to exit to the viewing side) is arbitrarily adjusted by suitably making the resistance values of the connecting portions 34 corresponding to the display pixels different.

F: Other Embodiments (1) In the first to fourth embodiments, the bottom emission type display panel 1 is described, but the present invention may also be applied to a top emission type display panel 1. Here, in the bottom emission type display panel 1, from the viewpoint of suppressing the loss of emitting light, the construction in which the resistive layer 23 is interposed between the OLED elements 21 and the counter electrode 15 is described. However, in the top emission type display panel 1, a construction in which the resistive layer 23 is interposed between the pixel electrodes 11 and the OLED elements 21 is preferable.

(2) The present invention may be applied to electro-optical devices using electro-optical elements other than the OLED element. As electro-optical devices to which the present invention is applied, a plasma display panel (PDP) using a high-pressure gas, such as helium or neon, as the electro-optical element and a field emission display (FED) using a fluorescent substance as the electro-optical element may be included.

G: Electronic Apparatus

Figure 24:
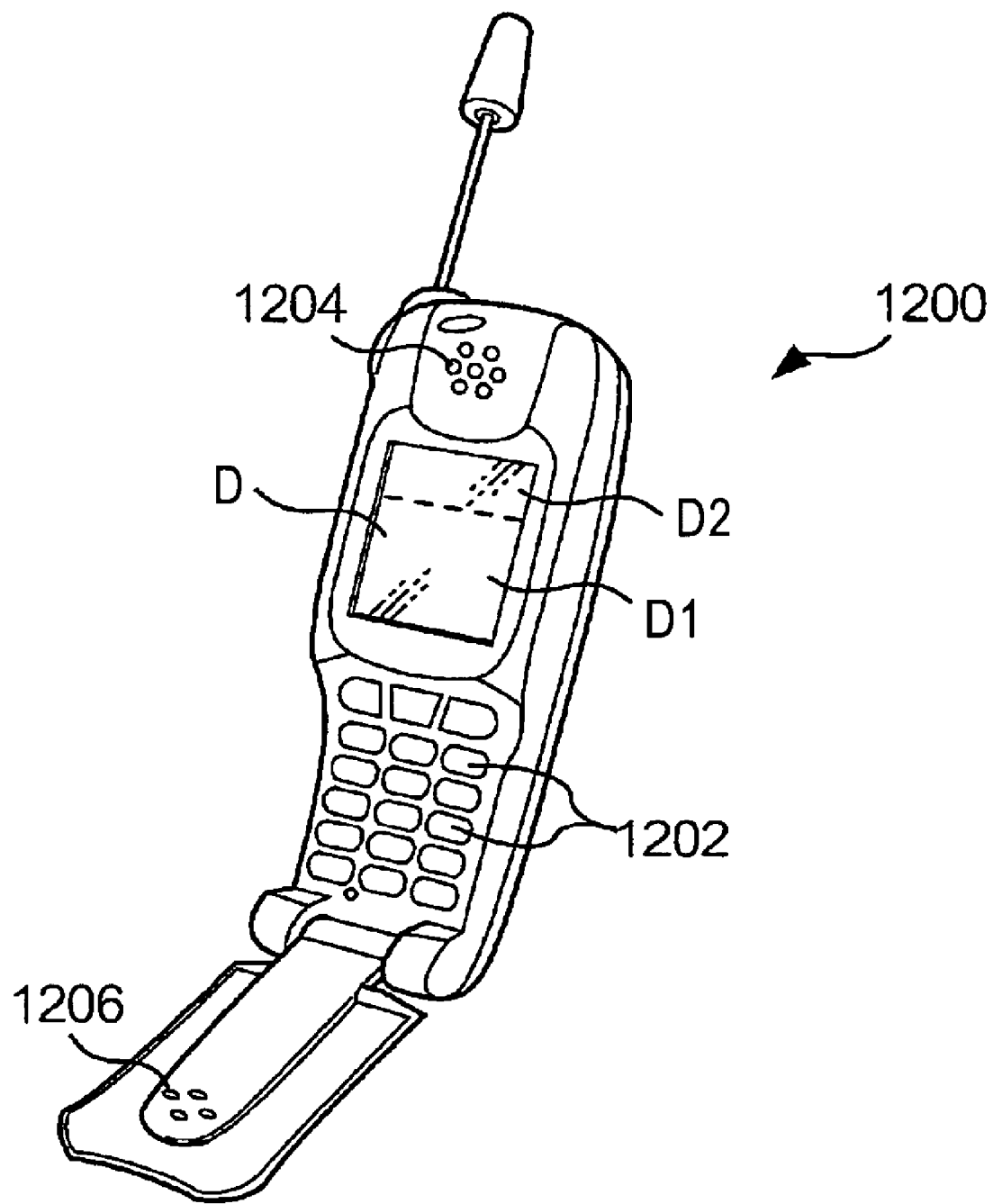
FIG. 24 is a perspective view showing a construction of a cellular phone which is an example of an electronic apparatus according to the present invention.

Next, an electronic apparatus comprising the electro-optical device according to the present invention will be described. FIG. 24 is a perspective view showing a construction of a cellular phone comprising the electro-optical device to which the present invention is applied. As shown in FIG. 24, a cellular phone 1200 comprises a plurality of operating buttons 1202 operated by a user, a receiver 1204 for outputting voice received from other terminal devices, and a transmitter 1206 for inputting voice to be transmitted to the other terminal devices. Further, the cellular phone 1200 comprises an electro-optical device D (100 to 104) for displaying various images. The display region of the electro-optical device D is divided into a first region D1 and a second region D2. The first region D1 of these regions is a region in which various images are displayed while suitably changing by a dot matrix type display method. Meanwhile, the second region D2 is a region in which an object image is fixedly displayed according to the present invention. That is, the OLED elements 21 are selectively arranged only in the pixel regions 511 constituting the object image among the plurality of unit regions 51 that divide the second region D2 (the first embodiment). Alternatively, the display pixels selected as ones constituting the object image among the plurality of pixels that are arranged in the second region D2 are electrically connected to the power supply circuit 8 (the second to fourth embodiments).

Moreover, other than the cellular phone shown in FIG. 24, as an electronic apparatus for which the electro-optical device according to the present invention is used, a personal computer, a liquid crystal television, a view finder type or monitor-direct-view type video recorder, a car navigation device, a pager, an electronic organizer, an electronic calculator, a word processor, a workstation, a television telephone, a POS terminal, a device comprising a touch panel, and the like may be included.

What is claimed is:

1. A method of manufacturing an electro-optical device having a plurality of unit regions, a first electrode, and a second electrode, each of the unit regions of the plurality of unit regions being approximately the same shape and size and arranged in a matrix on a surface of a flat plate-shaped base substrate, the method comprising:
   a step of forming the first electrode in each of the plurality of unit regions;
   a step of forming electro-optical elements in pixel regions selectively, all of the pixel regions being a plurality of first unit regions constituting a predetermined image among the plurality of unit regions;
   a step of forming insulators for electrically isolating the first electrode from the second electrode in non-pixel regions, all of the non-pixel regions being a plurality of second unit regions other than the plurality of first unit regions among the plurality of unit regions; and
   a step of forming the second electrode opposite to the first electrode with the electro-optical elements interposed therebetween.

2. The method of manufacturing an electro-optical device according to claim 1, further comprising:
   a step of forming partial insulators interposed between the first electrode and the second electrode so as to overlap parts of the electro-optical elements as viewed from the direction perpendicular to the surface of the base substrate.

3. The method of manufacturing an electro-optical device according to claim 2,
   wherein, in the step of forming the partial insulators, the partial insulators are formed by ejecting liquid droplets including an insulating material from an ejection slot so that the liquid droplets land on the base substrate.

4. The method of manufacturing an electro-optical device according to claim 1, the step of forming the second electrode being performed after the step of forming electro-optical elements and the step of forming insulators.

5. A method of manufacturing an electro-optical device having a plurality of unit regions, a first electrode, and a second electrode, each of the unit regions of the plurality of unit regions being approximately the same shape and size and arranged in a matrix on a surface of a flat plate-shaped base substrate, the method comprising:
   a step of forming the first electrode in each of the plurality of unit regions;
   a step of forming electro-optical elements in each of the plurality of unit regions;
   a step of forming the second electrode opposite to the first electrode with the electro-optical elements interposed therebetween; and
   a step of forming insulators for electrically isolating the first electrode from the second electrode in non-pixel regions, all of the non-pixel regions being a plurality of second unit regions other than a plurality of first unit regions constituting a predetermined image among the plurality of unit regions.

6. The method of manufacturing an electro-optical device according to claim 5, further comprising:
   a step of forming partial insulators interposed between the first electrode and the second electrode so as to overlap parts of the electro-optical elements as viewed from the direction perpendicular to the surface of the base substrate.

7. The method of manufacturing an electro-optical device according to claim 5, the step of forming the second electrode being performed after the step of forming electro-optical elements and the step of forming insulators.

8. A method of manufacturing an electro-optical device having a plurality of unit regions consisting of pixel regions and non-pixel regions, a first electrode, and a second electrode, each of the unit regions of the plurality of unit regions being approximately the same shape and size and arranged in a matrix on a surface of a flat plate-shaped base substrate, the method comprising:

a step of forming the first electrode in each of the plurality of unit regions;

a step of forming spacers in gaps between adjacent unit regions;

a step of forming electro-optical elements selectively in the pixel regions of the unit regions and not in the non-pixel regions of the unit regions by ejecting liquid droplets including an electro-optical material so that the liquid droplets land onto regions surrounded by the spacers, all of the pixel regions being a plurality of first unit regions constituting a predetermined image among the plurality of unit regions; and a step of forming the second electrode opposite to the first electrode with the electro-optical elements interposed therebetween.

9. The method of manufacturing an electro-optical device according to claim 8, the step of forming the second electrode being performed after the step of forming electro-optical elements and the step of forming the spacers.

* * * * *